United States Patent
Hatano et al.

(10) Patent No.: US 10,446,737 B2
(45) Date of Patent: Oct. 15, 2019

(54) PIEZOELECTRIC ELEMENT AND METHOD OF MANUFACTURING THE SAME

(71) Applicant: TAIYO YUDEN CO., LTD., Taito-ku, Tokyo (JP)

(72) Inventors: Keiichi Hatano, Takasaki (JP); Sumiaki Kishimoto, Takasaki (JP); Tomohiro Harada, Takasaki (JP); Yutaka Doshida, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 287 days.

(21) Appl. No.: 15/455,034

(22) Filed: Mar. 9, 2017

(65) Prior Publication Data
US 2017/0263845 A1  Sep. 14, 2017

(30) Foreign Application Priority Data
Mar. 10, 2016 (JP) .................................. 2016-047615

(51) Int. Cl.
*H01L 41/187* (2006.01)
*H01L 41/047* (2006.01)
(Continued)

(52) U.S. Cl.
CPC ........ *H01L 41/0477* (2013.01); *H01L 41/083* (2013.01); *H01L 41/1873* (2013.01); *H01L 41/273* (2013.01); *H01L 41/29* (2013.01)

(58) Field of Classification Search
CPC ............... H01L 41/0477; H01L 41/083; H01L 41/1873; H01L 41/273; H01L 41/29
(Continued)

(56) References Cited

U.S. PATENT DOCUMENTS 9,530,563 B2 * 12/2016 Imura .................. H01G 4/1218
2008/0061263 A1 * 3/2008 Kawada ................ C04B 35/495
252/62.9 PZ
(Continued)

FOREIGN PATENT DOCUMENTS

CN        1754858 A     4/2006
CN      101269962 A     9/2008
(Continued)

OTHER PUBLICATIONS

Guo et al., Phase transitional behavior and piezoelectric properties of (Na0.5K0.5)Nb03-LiNb03 ceramics, Applied Physics Letters, Nov. 1, 2004, 4121-4123, vol. 85, No. 18.
(Continued)

*Primary Examiner* — Thomas M Dougherty
(74) *Attorney, Agent, or Firm* — Law Office of Katsuhrio Arai

(57) ABSTRACT

A piezoelectric element which is a single-layer or laminated piezoelectric element has a first electrode, a second electrode, and a piezoelectric ceramic layer. The first electrode and second electrode contain silver by 50 percent by weight or more. The piezoelectric ceramic layer is placed between the first electrode and second electrode, and constituted by a polycrystalline substance of alkali niobate piezoelectric ceramic containing at least one alkali earth metal being calcium, strontium, or barium, and silver. According to this constitution, the electrical resistance and piezoelectric property can be improved, and consequently high reliability and good piezoelectric characteristics can be achieved.

11 Claims, 6 Drawing Sheets

(51) Int. Cl.
*H01L 41/09* (2006.01)
*H01L 41/273* (2013.01)
*H01L 41/29* (2013.01)
*H01L 41/083* (2006.01)

(58) Field of Classification Search
USPC .......................................................... 310/358
See application file for complete search history.

(56) References Cited

U.S. PATENT DOCUMENTS

| | | | |
|---|---|---|---|
| 2009/0295255 A1* | 12/2009 | Nagaya | C01G 35/006 310/358 |
| 2010/0102679 A1 | 4/2010 | Kawada | |
| 2010/0231096 A1* | 9/2010 | Saito | H01L 41/43 310/365 |
| 2012/0187211 A1* | 7/2012 | Nakamura | F02M 51/0603 239/102.2 |
| 2012/0229953 A1* | 9/2012 | Hatano | C04B 35/495 361/321.4 |
| 2014/0055009 A1* | 2/2014 | Hatano | H01L 41/1873 310/366 |

FOREIGN PATENT DOCUMENTS

| | | |
|---|---|---|
| CN | 104529445 A | 4/2015 |
| EP | 1382588 A1 | 1/2004 |
| JP | 2002068835 A | 3/2002 |
| JP | 2003342069 A | 12/2003 |
| JP | 2004300012 A | 10/2004 |
| JP | 2006124271 A | 5/2006 |
| JP | 2007258280 A | 10/2007 |
| JP | 2009290046 A | 12/2009 |
| JP | 2010180121 A | 8/2010 |
| JP | 2013014470 A | 1/2013 |
| JP | 2014043358 A | 3/2014 |
| WO | 2008152851 A1 | 12/2008 |

OTHER PUBLICATIONS

Saite et al., Lead-free piezoceramics, Nature, Nov. 4, 2004, 84-87, vol. 432.

A First Office Action issued by the State Intellectual Property Office of China dated Nov. 2, 2018 for Chinese counterpart application No. 201710140947.6.

A Notification of Reasons for Refusal issued by the Japanese Patent Office, dated Sep. 25, 2018, for related Japanese application No. 2016-047615.

* cited by examiner

PIEZOELECTRIC ELEMENT AND METHOD OF MANUFACTURING THE SAME

BACKGROUND

Field of the Invention

The present invention relates to a piezoelectric element using alkali niobate piezoelectric ceramic, as well as a method of manufacturing such piezoelectric element.

Description of the Related Art

Piezoelectric elements are electronic components that utilize the characteristics of piezoelectric ceramics to convert electrical energy to mechanical energy and vice versa. Structurally, a piezoelectric element is constituted by a piezoelectric ceramic and a pair of electrodes sandwiching it.

Piezoelectric elements can convert mechanical energy, such as vibration or pressure, to electrical energy, and discharge the electrical energy as voltage between a pair of electrodes. On the other hand, piezoelectric elements can convert voltage between a pair of electrodes to mechanical energy, such as vibration or pressure, to move other objects or operate on its own.

As piezoelectric elements can generate vibrations of wide-ranging frequencies, they can be used in speakers, for example. To be more specific, piezoelectric elements can generate vibrations in frequency bands of 0 to 100 Hz that occur in our general living environment, vibrations in frequency bands of up to 20 kHz that can be recognized by humans as sounds, and vibrations in frequency bands of several to several tens of GHz such as electromagnetic waves.

On the other hand, piezoelectric elements can generate voltages in wide-ranging frequencies from the aforementioned vibrations.

Also, piezoelectric elements of laminated type are known. A laminated piezoelectric element is constituted in such a way that a laminate of multiple piezoelectric ceramic layers is sandwiched by internal electrodes. Typically, laminated piezoelectric elements are manufactured by sintering the piezoelectric ceramic layers and internal electrodes simultaneously. Laminated piezoelectric elements can be used in actuators, for example, because a large displacement can be obtained in the laminated direction of the multiple piezoelectric ceramic layers.

PZT piezoelectric ceramics offering high piezoelectric property are widely used for piezoelectric elements and laminated piezoelectric elements. In light of the trend of reducing the spread of lead in recent years, however, there is a search for Pb-free or low-Pb piezoelectric ceramics to replace the PZT counterparts. Technologies relating to Pb-free or low-Pb piezoelectric ceramics are disclosed in Non-patent Literatures 1 and 2, for example.

Also, alkali niobate piezoelectric ceramics are drawing attention, in particular, as Pb-free piezoelectric ceramics offering high piezoelectric property to replace the PZT counterparts. Technologies relating to alkali niobate piezoelectric ceramics are disclosed in Patent Literatures 1 to 9, for example.

BACKGROUND ART LITERATURES

[Patent Literature 1] Japanese Patent Laid-open No. 2002-068835

[Patent Literature 2] Japanese Patent Laid-open No. 2003-342069

[Patent Literature 3] Japanese Patent Laid-open No. 2004-300012

[Patent Literature 4] Japanese Patent Laid-open No. 2007-258280

[Patent Literature 5] International Patent Laid-open No. 2008/152851

[Patent Literature 6] Japanese Patent Laid-open No. 2009-290046

[Patent Literature 7] Japanese Patent Laid-open No. 2010-180121

[Patent Literature 8] Japanese Patent Laid-open No. 2013-14470

[Patent Literature 9] Japanese Patent Laid-open No. 2014-43358

[Non-patent Literature 1] Nature, 432 (4), 2004, pp. 84-87

[Non-patent Literature 2] Applied Physics Letters 85 (18), 2004, pp. 4121-4123

SUMMARY

With the progress of technology in recent years, there is a search for piezoelectric elements that are smaller yet offering higher performance. Reducing the size of piezoelectric elements requires technologies for fine-processing and thickness reduction of piezoelectric ceramics. However, piezoelectric ceramics tend to have lower electrical resistance, which makes it more difficult to ensure reliability, as they are miniaturized and become thinner.

Also, piezoelectric elements using alkali niobate piezoelectric ceramics use internal electrodes containing Ag. However, piezoelectric elements using alkali niobate piezoelectric ceramics may become unreliable if their electrical resistance drops due to diffusion of Ag contained in the internal electrodes.

On the other hand, use of internal electrodes free of Ag, or internal electrodes containing less Ag, is possible. However, reducing the content of Ag in the internal electrodes requires that a large quantity of Pd, which is much more expensive than Ag, be used. As a result, the manufacturing costs of piezoelectric elements having such constitution are substantially higher.

In light of the aforementioned situation, an object of the present invention is to provide technology to achieve a Pb-free piezoelectric element using alkali niobate piezoelectric ceramic, which offers high reliability as well as good piezoelectric characteristics and which can be manufactured at low cost.

Any discussion of problems and solutions involved in the related art has been included in this disclosure solely for the purposes of providing a context for the present invention, and should not be taken as an admission that any or all of the discussion were known at the time the invention was made.

To achieve the aforementioned object, the piezoelectric element pertaining to an embodiment of the present invention is a single-layer or laminated piezoelectric element.

The piezoelectric element has a first electrode, a second electrode, and a piezoelectric ceramic layer.

The first electrode and second electrode contain silver by 50 percent by weight or more.

The piezoelectric ceramic layer is placed between the first electrode and second electrode, and constituted by a polycrystalline substance of alkali niobate piezoelectric ceramic containing at least one alkali earth metal being calcium, strontium, or barium, and silver.

According to this constitution, the electrical resistance and piezoelectric property can be improved, and consequently high reliability and good piezoelectric characteristics can be achieved.

The polycrystalline substance may have a crystal grain size satisfying "100 nm≤D50≤800 nm."

The alkali niobate piezoelectric ceramic of this piezoelectric element has high electrical resistance, because it is constituted by a fine polycrystalline substance whose D50 is 800 nm or less. Also, because its D50 is 100 nm or more, this alkali niobate piezoelectric ceramic does not have an excessively fine crystal and therefore its piezoelectric property does not drop easily due to the stress generating on the grain boundaries of the crystal. As a result, a piezoelectric element offering high electrical resistance as well as good piezoelectric characteristics can be obtained.

The polycrystalline substance may have a crystal grain size satisfying "(D90−D10)/D50≤2.0."

The thus-constituted alkali niobate piezoelectric ceramic of the piezoelectric element is constituted by a polycrystalline substance of more uniform crystal grain size. As a result, the electrical resistance of the piezoelectric ceramic layer improves further.

Here, D10, D50 and D90 represent the grain sizes corresponding to 10%, 50% and 90% in cumulative percentage, respectively, based on cumulative distribution of crystal grain sizes.

The alkali niobate piezoelectric ceramic may be expressed by Composition Formula (1) below:

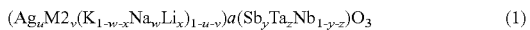

$$(Ag_uM2_v(K_{1-w-x}Na_wLi_x)_{1-u-v})a(Sb_yTa_zNb_{1-y-z})O_3 \quad (1)$$

(In Composition Formula (1), M2 represents at least one of calcium, strontium, and barium. Also, u, v, w, x, y, z, and a represent values satisfying the inequality expressions of 0.005<u≤0.05, 0.002<v≤0.05, 0.007<u+v≤0.1, 0≤w≤1, 0.02<x≤0.1, 0.02<w+x≤1, 0≤y≤0.1, 0≤z≤0.4, and 1<a≤1.1.)

This constitution further improves the electrical resistance and piezoelectric property of the piezoelectric ceramic layer.

The alkali niobate piezoelectric ceramic is such that, when the alkali niobate piezoelectric ceramic represents 100 percent by mol, the Li content is 0.2 percent by mol or more but 3.0 percent by mol or less, the Si content is 0.1 percent by mol or more but 3.0 percent by mol or less, and (Li content (percent by mol))/(Si content (percent by mol)) is 0.6 or more but 2.0 or less.

This constitution, with the addition of $Li_2O$ and $SiO_2$, can improve not only the sintering property of the piezoelectric ceramic layer, but it can also improve the piezoelectric characteristics of the piezoelectric element.

The alkali niobate piezoelectric ceramic may contain deposits of $Li_3NbO_4$.

The piezoelectric element of this constitution can be manufactured at low sintering temperature.

The alkali niobate piezoelectric ceramic may contain deposits of at least one of alkali silicate compound and alkali silicate-niobate compound.

This constitution can suppress not only volatilization of K, Na, and Li when the piezoelectric element is sintered, but also deposition of alkali metals at the crystal grain boundaries of the polycrystalline substance.

The coefficient of variation of the content of silver in the piezoelectric ceramic layer may be 20 percent or less.

This constitution achieves finer crystal over the entire region of the piezoelectric ceramic layer because silver is uniformly diffused in the piezoelectric ceramic layer. As a result, the insulation resistance of the piezoelectric ceramic layer improves further, which in turn improves the reliability of the piezoelectric element further.

The piezoelectric element may be constituted as a laminated type.

The piezoelectric element may further have a protection part that contains silver and covers the piezoelectric ceramic layer as well as at least one of the first electrode and second electrode.

Under this constitution, preferably the piezoelectric ceramic layer and protection part (consisting typically of side margin parts and cover parts), both of which contain silver, are close to each other in physical properties. More preferably the piezoelectric ceramic layer and protection part are made of the same material. This reduces internal stress in the piezoelectric element and ensures good performance.

The coefficient of variation of the content of silver in the protection part may be 20 percent or less.

This constitution makes the fine structure of the piezoelectric ceramic layer denser, and thus reduces the D10, D50, and D90, because Ag is uniformly diffused in the piezoelectric ceramic layer in such a way that the coefficient of variation becomes 20 percent or less. As a result, the electrical resistance of the piezoelectric ceramic layer improves further, which in turn improves the reliability of the piezoelectric element further.

The piezoelectric element may further have a first external electrode and a second external electrode.

The first electrodes and second electrodes may be placed alternately with piezoelectric ceramic layers in between, with the first electrodes connected to the first external electrode, and the second electrodes connected to the second external electrode.

With the laminated piezoelectric element of this constitution, electrical energy between the first external electrode and second external electrode can be favorably converted to mechanical energy in the laminated direction of the piezoelectric ceramic layers placed between the first internal electrodes and second internal electrodes that are placed alternately, and vice versa.

According to the method of manufacturing laminated piezoelectric element pertaining to an embodiment of the present invention, unsintered sheets are prepared for forming piezoelectric ceramic layers which are constituted by a polycrystalline substance of alkali niobate piezoelectric ceramic whose mol ratio of at least one alkali earth metal being calcium, strontium or barium, in site A, is over 0.2 percent by mol but no more than 5 percent by mol.

Unsintered electrodes of 50 percent by weight or more in silver content, which are used for forming internal electrodes, are placed on the unsintered sheets.

The unsintered sheets on which the unsintered electrodes have been placed are stacked together to produce a laminate.

As the laminate is sintered, the internal electrodes and piezoelectric ceramic layers are formed, while at the same time the silver diffuses from the internal electrodes to the piezoelectric ceramic layers.

This constitution makes the fine structure of the piezoelectric ceramic layer denser, and thus reduces the D10, D50, and D90, because the silver contained in the internal electrodes diffuses to the piezoelectric ceramic layers during sintering. As a result, a laminated piezoelectric element offering high electrical resistance as well as good piezoelectric characteristics can be obtained.

The unsintered sheets may not contain silver.

This constitution makes it easier for the silver contained in the internal electrodes, to diffuse in a favorable manner to the piezoelectric ceramic layers during sintering. In this case, the greater ease of diffusion of the silver contained in the internal electrodes causes the silver content in the internal electrodes to drop relatively, which means that, with silver palladium electrodes or the like, for example, the palladium content in the electrodes improves relatively, and consequently sintering at higher temperature becomes possible.

In the sintering mentioned above, the coefficient of variation of the content of silver in the piezoelectric ceramic layer may be 20 percent or less.

As a result, a laminated piezoelectric element having even higher reliability can be manufactured.

Technology to achieve a Pb-free piezoelectric element using alkali niobate piezoelectric ceramic, which offers high reliability as well as good piezoelectric characteristics, and which can be manufactured at low cost, can be provided.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DESCRIPTION OF THE SYMBOLS

Figure 1:
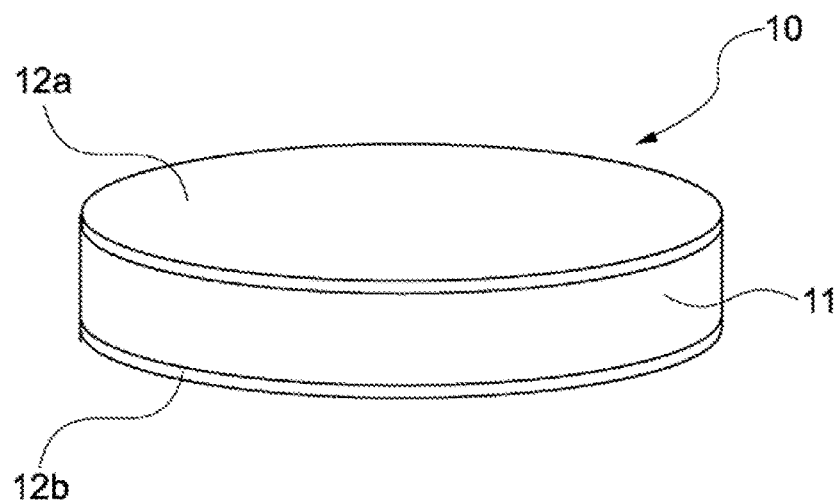
FIG. 1 is a Schematic perspective view showing a piezoelectric element pertaining to an embodiment of the present invention.

10—Piezoelectric element
11—Piezoelectric ceramic layer
12a, 12b—External electrode
100—Laminated piezoelectric element
101—Element body
102—Internal electrode
103—External electrode
104—Side margin part
105—Cover part
106—Piezoelectric ceramic layer

DETAILED DESCRIPTION OF EMBODIMENTS

An embodiment of the present invention is explained below by referring to the drawings.

[Rough Constitution of Piezoelectric Element 10]

FIG. 1 is a schematic perspective view showing a piezoelectric element 10 pertaining to an embodiment of the present invention. The piezoelectric element 10 is constituted as a single-layer piezoelectric element. The piezoelectric element 10 has a piezoelectric ceramic layer 11, a first electrode 12a, and a second electrode 12b.

The piezoelectric ceramic layer 11 is formed as a disk. The piezoelectric ceramic layer 11 is constituted by a polycrystalline substance of alkali niobate piezoelectric ceramic.

The electrodes 12a, 12b cover the entire top face and entire bottom face of the piezoelectric ceramic layer 11, respectively, and are effectively facing each other by sandwiching the piezoelectric ceramic layer 11 in between. The electrodes 12a, 12b are formed by silver (Ag) or an alloy of silver (Ag) and palladium (Pd), for example.

Increasing the Ag content in the electrodes 12a, 12b facilitates the diffusion of Ag from the electrodes 12a, 12b to the piezoelectric ceramic layer 11 when the piezoelectric element 10 is sintered. As a result, the piezoelectric ceramic layer 11 can be made a fine, uniform polycrystalline substance. Details on this point are described later.

Preferably the Ag content in the electrodes 12a, 12b is 50 percent by weight or more. This way, the aforementioned effects can be obtained in a more favorable manner. Needless to say, the electrodes 12a, 12b may be formed by pure silver.

This constitution allows the piezoelectric element 10 to convert electrical energy to mechanical energy, and vice versa, in a favorable manner. To be specific, when voltage is applied between the electrodes 12a, 12b, voltage is also applied to the piezoelectric ceramic layer 11 between the electrodes 12a, 12b and the piezoelectric ceramic layer 11 displaces. When pressure is applied to the piezoelectric ceramic layer 11, on the other hand, an electric potential difference generates between the electrodes 12a, 12b.

It should be noted that the shape of the piezoelectric ceramic layer 11 is not limited to disk, and may be cylinder, square cylinder, column, prism, or concave, for example. Also, the electrodes 12a, 12b need to cover the piezoelectric ceramic layer 11 only partially, instead of covering its entire top face and entire bottom face.

[Rough Constitution of Laminated Piezoelectric Element 100]

Figure 2:
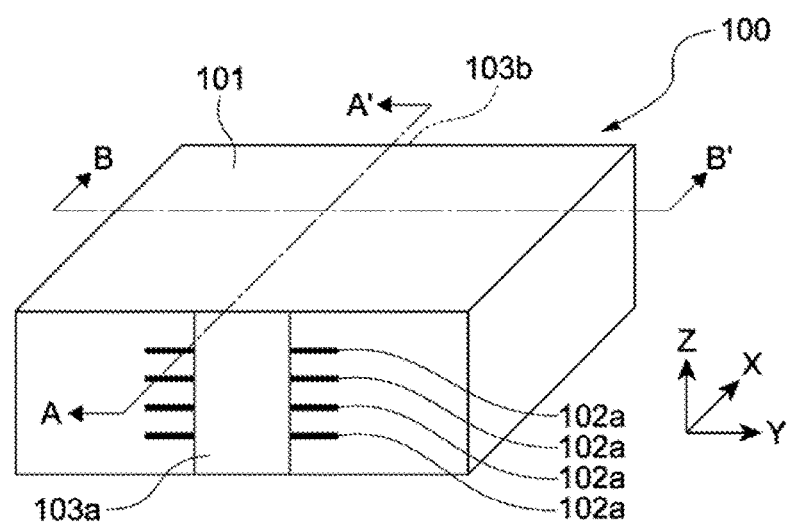
FIG. 2 is a Schematic perspective view showing a laminated piezoelectric element pertaining to an embodiment of the present invention.
Figure 3:
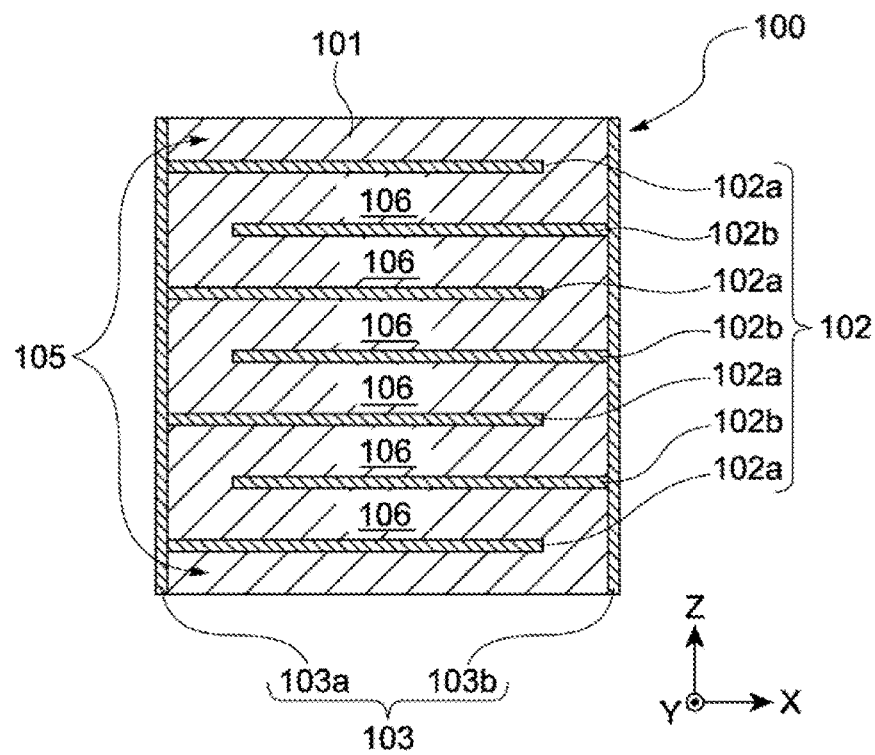
FIG. 3 is a Section view of the aforementioned laminated piezoelectric element along line A-A'.
Figure 4:
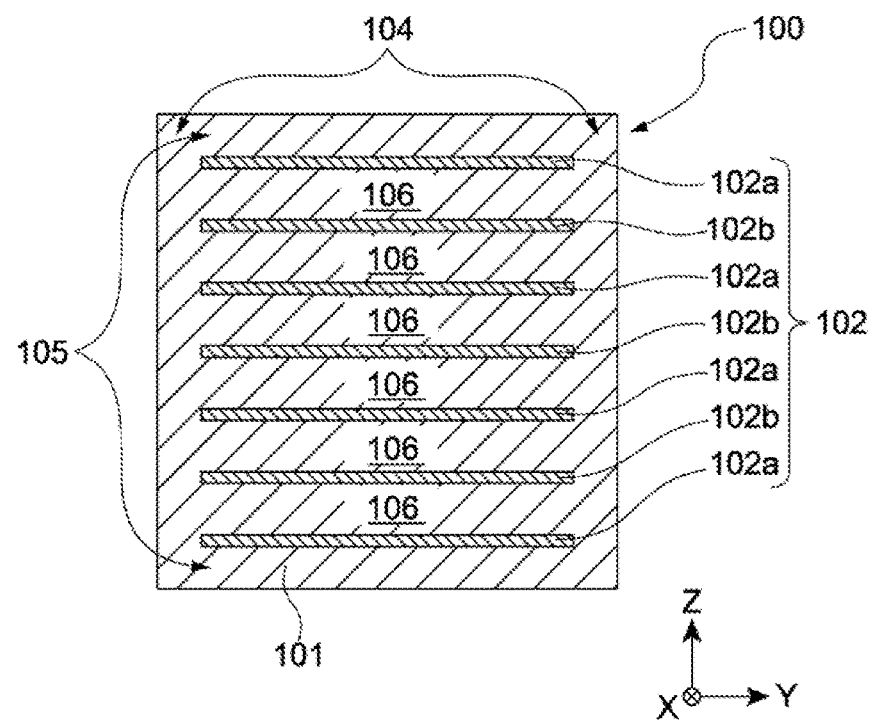
FIG. 4 is a Section view of the aforementioned laminated piezoelectric element along line B-B'.

FIG. 2 is a schematic perspective view showing a laminated piezoelectric element 100 pertaining to an embodiment of the present invention. FIG. 3 is a section view of the laminated piezoelectric element 100 along line A-A' in FIG. 2. FIG. 4 is a section view of the laminated piezoelectric element 100 along line B-B' in FIG. 2. FIGS. 2 to 4 show the same X-axis, Y-axis, and Z-axis, where the X-axis, Y-axis, and Z-axis are orthogonal to one another.

The laminated piezoelectric element 100 has an element body 101, internal electrodes 102, and external electrodes 103. The element body 101 is formed as a rectangular solid having sides that are parallel to the X-axis, Y-axis, and Z-axis. It should be noted that the shape of the element body 101 is not limited to the foregoing. For example, each face of the element body 101 may be curved and the entire element body 101 may be rounded.

The internal electrodes 102 are placed inside the element body 101, while the external electrodes 103 are placed on the end faces of the element body 101.

The internal electrodes 102 comprise first internal electrodes 102a and second internal electrodes 102b. Both the first internal electrodes 102a and second internal electrodes 102b extend in parallel with the XY plane, and are stacked alternately in the Z-axis direction. The element body 101 has piezoelectric ceramic layers 106, each formed between the first internal electrode 102a and the second internal electrode 102b. The piezoelectric ceramic layers 106 are formed by a polycrystalline substance of alkali niobate piezoelectric ceramic.

The internal electrodes 102 are formed by silver (Ag) or an alloy of silver (Ag) and palladium (Pd), for example. Particularly in this embodiment, preferably the internal electrodes 102 contain a large quantity of Ag. This reduces the use quantity of Pd, which in turn reduces the manufacturing cost of the laminated piezoelectric element 100.

Also, increasing the Ag content in the internal electrodes 102 facilitates the diffusion of Ag from the internal electrodes 102 to the piezoelectric ceramic layers 106 when the laminated piezoelectric element 100 is sintered. As a result, the piezoelectric ceramic layers 106 can be made a fine, uniform polycrystalline substance. Details on this point are described later.

Preferably the Ag content in the internal electrodes 102 is 50 percent by weight or more. This way, the aforementioned effects can be obtained in a more favorable manner. Needless to say, the internal electrodes 102 may be formed by pure silver.

The external electrodes 103 comprise a first external electrode 103a and a second external electrode 103b, which are provided on the two end faces of the element body 101 in the X-axis direction, respectively. The first external electrode 103a connects to the first internal electrodes 102a, while the second external electrode 103b connects to the second internal electrodes 102b.

This constitution allows the laminated piezoelectric element 100 to convert electrical energy to mechanical energy, and vice versa, in a favorable manner. To be specific, when voltage is applied between the external electrodes 103, voltage is also applied to each piezoelectric ceramic layer 106 between the internal electrodes 102a, 102b and the element body 101 displaces in the Z-axis direction. When pressure is applied to the element body 101 in the Z-axis direction, on the other hand, an electric potential difference generates between the external electrodes 103.

Also, side margin parts 104 are formed between the two side faces of the element body 101 in the Y-axis direction and the internal electrodes 102, while cover parts 105 are formed on the top face and bottom face of the element body 101 in the Z-axis direction. The side margin parts 104 and cover parts 105 function as a protection part that protects the piezoelectric ceramic layers 106 and internal electrodes 102.

[Piezoelectric Ceramic Layer]
(Rough Constitution)

The piezoelectric ceramic layer 11 of the piezoelectric element 10 shown in FIG. 1, and the piezoelectric ceramic layers 106 of the laminated piezoelectric element 100 shown in FIGS. 2 to 4, are constituted by a polycrystalline substance of alkali niobate piezoelectric ceramic having a similar constitution.

The following explains a general alkali niobate piezoelectric ceramic first, and then explains the alkali niobate piezoelectric ceramic pertaining to this embodiment.

(General Alkali Niobate Piezoelectric Ceramic)

Figure 5:
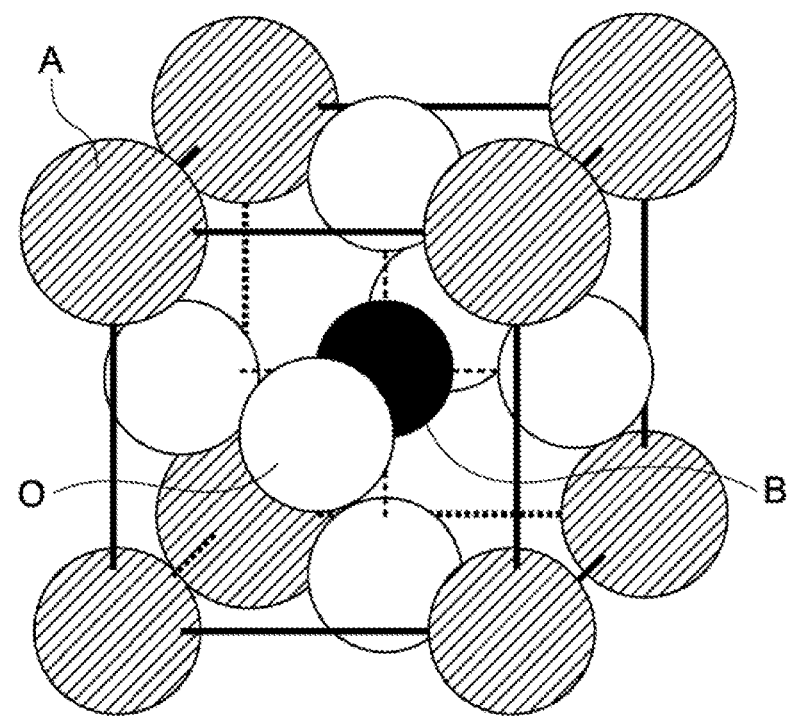
FIG. 5 is a Model showing a unit lattice of the perovskite structure.

An alkali niobate piezoelectric ceramic crystal has a perovskite structure. The perovskite structure has a unit lattice shown in FIG. 5, and is expressed by the composition formula $ABO_3$. With an alkali niobate piezoelectric ceramic, the unit lattice as shown in FIG. 5 has site A at which potassium (K), sodium (Na), lithium (Li), or other alkali metal atom is conformationally positioned, and site B at which niobium (Nb), antimony (Sb), tantalum (Ta), or other metal atom is conformationally positioned.

A general alkali niobate piezoelectric ceramic is expressed by the composition formula below, for example:

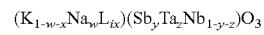

$$(K_{1-w-x}Na_wLi_x)(Sb_yTa_zNb_{1-y-z})O_3$$

It should be noted that, in this composition formula, w, x, y, and z represent the mol ratios of the respective elements, taking values satisfying the inequality expressions of $0 \leq w \leq 0.2$, $0 \leq x \leq 0.2$, $0 \leq y \leq 1$, $0 \leq z \leq 0.4$, and $y+z \leq 1$.

Here, using an alkali niobate piezoelectric ceramic for the piezoelectric ceramic layers 106 of the laminated piezoelectric element 100 shown in FIGS. 2 to 4 makes it easier for the Ag contained in the internal electrodes 102 to diffuse to the piezoelectric ceramic layers 106 when the laminated piezoelectric element 100 is sintered. With a general alkali niobate piezoelectric ceramic as mentioned above, crystal growth is promoted due to diffusion of Ag.

In other words, using a general alkali niobate piezoelectric ceramic for the piezoelectric ceramic layers 106 of the laminated piezoelectric element 100 makes each crystal constituting the polycrystalline substance of the piezoelectric ceramic layers 106 larger. As a result, high insulation resistance cannot be achieved with the piezoelectric ceramic layers 106 constituted by a general alkali niobate piezoelectric ceramic.

Also, a general alkali niobate piezoelectric ceramic is likely to create an Ag-rich composition due to diffusion of Ag. This means that, with a general alkali niobate piezoelectric ceramic, deposition of highly conductive Ag compounds at the crystal grain boundaries of the polycrystalline substance lowers the insulation resistance of the piezoelectric ceramic layers 106.

Furthermore, with a general alkali niobate piezoelectric ceramic, the Ag-rich composition may lead to Nb and Li discharging at the crystal grain boundaries of the polycrystalline substance, thus causing $Li_3NbO_4$, $(Li, Ag)_3NbO_4$ and other crystal phases to deposit, for example. These crystal phases can contribute to the lowering of sintering temperature, but they do not have piezoelectric property. As a result, deposition of these crystal phases in large quantities causes the piezoelectric property of the piezoelectric ceramic layers 106 to drop.

Similarly, using an alkali niobate piezoelectric ceramic for the piezoelectric ceramic layer 11 of the piezoelectric element 10 shown in FIG. 1 makes it easier for the Ag contained in the electrodes 12a, 12b to diffuse to the piezoelectric ceramic layer 11 when the piezoelectric element 10 is sintered.

In other words, using a general alkali niobate piezoelectric ceramic for the piezoelectric ceramic layer 11 of the piezoelectric element 10 may cause the electrical resistance and piezoelectric property of the piezoelectric ceramic layer 11 of the piezoelectric element 10 to drop, as is the case with the piezoelectric ceramic layer 106 of the laminated piezoelectric element 100.

As described above, combining electrodes containing Ag and a general alkali niobate piezoelectric ceramic tends to cause the electrical resistance and piezoelectric property of the alkali niobate piezoelectric ceramic to drop. Accordingly, it is difficult to achieve high reliability as well as good piezoelectric characteristics with the piezoelectric element 10 or laminated piezoelectric element 100 using a general alkali niobate piezoelectric ceramic.

(Alkali Niobate Piezoelectric Ceramic Pertaining to this Embodiment)

(1) Basic Constitution

On the other hand, the alkali niobate piezoelectric ceramic pertaining to this embodiment contains at least one alkali earth metal M2, being calcium (Ca), strontium (Sr), or barium (Ba), and silver (Ag). The alkali earth metal M2 and Ag are primarily substituted for site A of the perovskite structure.

Typically, the alkali niobate piezoelectric ceramic pertaining to this embodiment is expressed by Composition Formula (1) below.

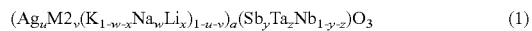

$$(Ag_u M2_v (K_{1-w-x} Na_w Li_x)_{1-u-v})_a (Sb_y Ta_z Nb_{1-y-z}) O_3 \quad (1)$$

Here, preferably u, v, w, x, y, z, and a in Composition Formula (1) represent the mol ratios of the respective elements, taking values satisfying the inequality expressions of $0.005 < u \leq 0.05$, $0.002 < v \leq 0.05$, $0.007 < u+v \leq 0.1$, $0 \leq w \leq 1$, $0.02 < x \leq 0.1$, $0.02 < w+x \leq 1$, $0 \leq y \leq 0.1$, $0 \leq z \leq 0.4$, and $1 < a \leq 1.1$.

It should be noted that the alkali niobate piezoelectric ceramic pertaining to this embodiment may have site A and site B in its perovskite structure substituted by other elements as deemed necessary, or contain other crystal phases and non-crystal phases at the crystal grain boundaries and grain boundary triple junctions of its polycrystalline substance.

In some embodiments, any one or more elements described as alternative or optional element(s) in the present disclosure can explicitly be eliminated from the ceramic grains. Further, in some embodiments, the ceramic grains may consisting of required elements described in the present disclosure; however, "consisting of" does not exclude additional components that are unrelated to the invention such as impurities ordinarily associated therewith.

(2) Actions of Alkali Earth Metal M2 and Ag

The alkali earth metal M2 is added in the manufacturing process as an additive for the alkali niobate piezoelectric ceramic. On the other hand, Ag is primarily supplied to the alkali niobate piezoelectric ceramic from the electrodes. This means that, with the laminated piezoelectric element 100 shown in FIGS. 2 to 4, the Ag contained in the internal electrodes 102 diffuses to the alkali niobate piezoelectric ceramic during sintering. Also, with the piezoelectric element 10 shown in FIG. 1, the Ag contained in the electrodes 12a, 12b diffuses to the alkali niobate piezoelectric ceramic during sintering.

With the alkali niobate piezoelectric ceramic pertaining to this embodiment, at least one alkali earth metal M2, being calcium, strontium, or barium, suppresses the grain growth caused by diffusion of Ag. Further, with the alkali niobate piezoelectric ceramic pertaining to this embodiment, the diffusion behavior of Ag atoms promotes the refinement of the crystal, and a very fine polycrystalline substance is obtained as a result. This improves the insulation resistance of the alkali niobate piezoelectric ceramic.

Furthermore, with the alkali niobate piezoelectric ceramic pertaining to this embodiment, high piezoelectric property can be retained by keeping the content of the alkali earth metal M2 to 5.0 percent by mol or less.

As described above, the constitution proposed by the present invention can achieve the piezoelectric element 10 and laminated piezoelectric element 100 having the alkali niobate piezoelectric ceramic which offers high reliability as well as good piezoelectric characteristics, and can be manufactured at low cost.

Here, as mentioned above, a general alkali niobate piezoelectric ceramic causes the grain growth to be promoted due to diffusion of Ag. With the alkali niobate piezoelectric ceramic pertaining to this embodiment, on the other hand, the alkali earth metal M2 that has been added beforehand acts in a manner suppressing grain growth due to diffusion of Ag. This means that, with the alkali niobate piezoelectric ceramic pertaining to this embodiment, Ag does diffuse but grain growth is not promoted easily.

Furthermore, with the alkali niobate piezoelectric ceramic pertaining to this embodiment, Ag atoms act in a manner refining the crystal through its diffusion behavior during sintering. Also, with the alkali niobate piezoelectric ceramic pertaining to this embodiment, Ag is not distributed unevenly, but it diffuses uniformly. This makes the alkali niobate piezoelectric ceramic pertaining to this embodiment a fine, uniform polycrystalline substance. This means that, not only with the laminated piezoelectric element 100 in the aforementioned example, but also with the piezoelectric element 10, a similarly fine, uniform polycrystalline substance can also be achieved by introducing Ag as an additive in an appropriate manner.

As described above, in this embodiment a fine, uniform polycrystalline substance of alkali niobate piezoelectric ceramic can be obtained through the synergistic effects of the alkali earth metal M2 and Ag. This means that, with the alkali niobate piezoelectric ceramic pertaining to this embodiment, not only grain growth due to diffusion of Ag is suppressed by the alkali earth metal M2, but diffusion of Ag is also actively utilized to obtain a fine, uniform polycrystalline substance.

With the piezoelectric element 10 and laminated piezoelectric element 100, the piezoelectric ceramic layer 11 and piezoelectric ceramic layer 106 constituted by a fine, uniform polycrystalline substance can be obtained by utilizing the alkali niobate piezoelectric ceramic pertaining to this embodiment. As a result, the piezoelectric element 10 and laminated piezoelectric element 100 pertaining to this embodiment can provide high reliability.

In addition to the above, the alkali niobate piezoelectric ceramic pertaining to this embodiment is constituted in such a way that the diffusing Ag is substituted primarily for site A in the perovskite structure. As a result, deposition of highly conductive Ag compounds at the crystal grain boundaries of the polycrystalline substance in the piezoelectric ceramic layer 11 and piezoelectric ceramic layer 106, can be suppressed. This assures high electrical resistance at the piezoelectric ceramic layer 11 and piezoelectric ceramic layer 106, which in turn allows the piezoelectric element 10 and laminated piezoelectric element 100 to achieve high reliability.

Furthermore, with the alkali niobate piezoelectric ceramic pertaining to this embodiment, the monovalent cation at site A is substituted by the alkali earth metal M2 which is a divalent cation, and when this point alone is given focus, a conclusion is drawn that defects occur easily at site A. With the alkali niobate piezoelectric ceramic pertaining to this embodiment, however, Ag that easily becomes a monovalent cation continues to be supplied from the additive and internal electrodes 102 as the piezoelectric element 10 and laminated piezoelectric element 100 are sintered, and therefore site A is compensated by Ag at all times. The result is that, with the alkali niobate piezoelectric ceramic pertaining to this embodiment, defects do not occur easily at site A.

(3) Contents of Alkali Earth Metal M2 and Ag

Under Composition Formula (1) for the alkali earth metal M2 in the alkali niobate piezoelectric ceramic pertaining to this embodiment, the mol ratio at site A is over 0.2 percent by mol but no more than 5.0 percent by mol. If the mol ratio at site A of the alkali earth metal M2 is 0.2 mol or less, grain growth due to diffusion of Ag may not be suppressed fully. If the mol ratio at site A of the alkali earth metal M2 is over 5.0 mol, on the other hand, the piezoelectric property of the piezoelectric ceramic layer 11 and piezoelectric ceramic layer 106 tends to drop.

Furthermore, under Composition Formula (1) for the Ag in the alkali niobate piezoelectric ceramic pertaining to this embodiment, preferably the mol ratio at site A is 5.0 percent by mol or less. By keeping the mol ratio at site A of Ag to 5.0 percent by mol or less, deposition of Ag compounds at the crystal grain boundaries of the polycrystalline substance can be suppressed more effectively. This assures high electrical resistance at the piezoelectric ceramic layer 11 and piezoelectric ceramic layer 106, which in turn allows the piezoelectric element 10 and laminated piezoelectric element 100 to achieve high reliability.

It should be noted that the alkali earth metal M2 in the alkali niobate piezoelectric ceramic pertaining to this embodiment may be constituted by any one of Ca, Sr, and Ba, or by solid solution of two or more of Ca, Sr and Ba.

(4) Other Additives

The alkali niobate piezoelectric ceramic pertaining to this embodiment may contain various additives other than the alkali earth metal M2, as necessary. Additives such as those listed below can be added to the alkali niobate piezoelectric ceramic, as additives, during the manufacturing process of the piezoelectric element 10 and laminated piezoelectric element 100.

$Li_2O$, $SiO_2$

The alkali niobate piezoelectric ceramic pertaining to this embodiment may contain $Li_2O$ and $SiO_2$. Adding $Li_2O$ and $SiO_2$ can not only improve the sintering property of the piezoelectric ceramic layer 11 and piezoelectric ceramic layer 106, but it can also improve the piezoelectric characteristics of the piezoelectric element 10 and laminated piezoelectric element 100.

On this point, preferably the additive quantity of $Li_2O$ is 0.1 percent by mol or more but 1.5 percent by mol or less, while the additive quantity of $SiO_2$ is 0.1 percent by mol or more but 3.0 percent by mol or less, relative to 100 percent by mol of the alkali niobate piezoelectric ceramic constituting the main phase. Furthermore, more preferably the ratio of the additive quantity of $SiO_2$ to the additive quantity of $Li_2O$, or specifically (Additive quantity of $Li_2O$ (percent by mol))/(Additive quantity of $SiO_2$ (percent by mol)) is 0.3 or more but 1.0 or less.

This way, the alkali niobate piezoelectric ceramic, once sintered, contains 0.2 percent by mol or more but 3.0 percent by mol or less of Li, and 0.1 percent by mol or more but 3.0 percent by mol or less of Si. Also, the ratio of the Li content to the Si content, or specifically (Li content (percent by mol))/(Si content (percent by mol)) becomes 0.6 or more but 2.0 or less.

In addition, $Li_2SiO_3$, $Li_4SiO_4$ and other crystal phases or non-crystal phases containing Li and Si can be deposited as deposition phases by adding $SiO_2$. These deposition phases can suppress not only the volatilization of K, Na, and Li, but also the deposition of alkali metals at the crystal grain boundaries of the polycrystalline substance, when the laminated piezoelectric element 100 is sintered.

Other deposition phases having such effects include, among others: $K_3Nb_3O_6Si_2O_7$, $KNbSi_2O_7$, and other crystal phases or non-crystal phases containing K, Nb, Si, and O; $K_3LiSiO_4$, $KLi_3SiO_4$, and other crystal phases or non-crystal phases containing K, Li, Si, and O; and crystal phases or non-crystal phases containing K, Si, and O.

Na and Ag may be diffused in these deposition phases of alkali silicate compounds, alkali silicate niobate compounds, etc. Also, at least one of these deposition phases of alkali silicate compounds, alkali silicate niobate compounds, etc., needs to be deposited, but similar effects can also be achieved when two or more phases are compounded and deposited together.

MnO

The alkali niobate piezoelectric ceramic pertaining to this embodiment may contain MnO. MnO tends to be present at the grain boundary triple junctions of the polycrystalline substance of the alkali niobate piezoelectric ceramic. MnO also tends to be present near the electrodes. In other words, MnO tends to be present in the piezoelectric ceramic layer 11 of the piezoelectric element 10 near the electrodes 12a, 12b, and in the piezoelectric ceramic layers 106 of the laminated piezoelectric element 100 near the internal electrodes 102. MnO acts in a manner improving the electrical resistance of the piezoelectric ceramic layer 11 and piezoelectric ceramic layer 106.

Additionally, although the alkali earth metal M2 and Ag are primarily substituted for site A of the perovskite structure, as described above, some may be substituted for site B and cause the valences of Nb, Ta, and Sb at site B to fluctuate. Particularly when the alkali earth metal M2 and Ag are substituted for the pentavalent cation Nb, electron conductivity tends to manifest due to valence fluctuation. This causes the electrical resistance of the piezoelectric ceramic layer 11 and piezoelectric ceramic layer 106 to drop.

In this sense, MnO, when added, acts in a manner suppressing the valence fluctuation at site A as Mn atoms are partially substituted as solid solution for site A or introduced to the crystal lattice. To be more specific, Mn atoms assume stable forms in the crystal lattice as $Ca(Mn_{1/3}Nb_{2/3})O_3$, $Sr(Mn_{1/3}Nb_{2/3})O_3$, $Ba(Mn_{1/3}Nb_{2/3})O_3$, etc. In these forms, they can maintain the neutrality of the crystal structure. Accordingly, drop in the electrical resistance of the piezoelectric ceramic layer 11 and piezoelectric ceramic layer 106 can be prevented by adding MnO.

Preferably the additive quantity of MnO is 2.0 percent by mol or less relative to 100 percent by mol of the alkali niobate piezoelectric ceramic constituting the main phase. If the additive quantity of MnO exceeds 2.0 percent by mol, the piezoelectric characteristics of the alkali niobate piezoelectric ceramic constituting the main phase may drop.

It should be noted that the form in which Mn is present in the piezoelectric element 10 and laminated piezoelectric element 100 can be checked using a scanning electron microscope (SEM), transmission electron microscope (TEM), energy dispersive X-ray spectrometry (EDS), wavelength dispersive X-ray spectrometry (WDS), or the like, for example.

Transition Elements

The alkali niobate piezoelectric ceramic pertaining to this embodiment may contain at least one of Sc, Ti, V, Cr, Fe, Co, Ni, Cu, and Zu that are first-row transition elements, as necessary. This allows for adjustment of the sintering temperature, control of the grain growth, and extension of the life in high electric fields, of the piezoelectric element 10 and laminated piezoelectric element 100.

Additionally, the alkali niobate piezoelectric ceramic pertaining to this embodiment may contain at least one of Y, Mo, Ru, Rh, and Pd that are second-row transition elements, as necessary. This allows for adjustment of the sintering temperature, control of the grain growth, and extension of the life in high electric fields, of the piezoelectric element 10 and laminated piezoelectric element 100.

Furthermore, the alkali niobate piezoelectric ceramic pertaining to this embodiment may contain at least one of La, Ce, Pr, Nd, Sm, Eu, Gd, Tb, Dy, Ho, Er, Tm, Yb, Lu, Hf, W, Re, Os, Ir, Pt, and Au that are third-row transition elements, as necessary. This allows for adjustment of the sintering temperature, control of the grain growth, and extension of the life in high electric fields, of the piezoelectric element 10 and laminated piezoelectric element 100.

Needless to say, the alkali niobate piezoelectric ceramic pertaining to this embodiment may use two or more types of the aforementioned first-row transition elements, second-row transition elements and third-row transition elements in combination.

[Side Margin Parts 104 and Cover Parts 105]

Next, the details of the side margin parts 104 and cover parts 105 of the laminated piezoelectric element 100 shown in FIGS. 2 to 4 are explained.

Preferably the side margin parts 104 and cover parts 105 pertaining to this embodiment are formed by an alkali niobate piezoelectric ceramic similar to that constituting the piezoelectric ceramic layers 106, from the viewpoint of the percentage of shrinkage of the laminated piezoelectric element 100 during sintering, and that of mitigating the internal stress in the laminated piezoelectric element 100. Notwithstanding the foregoing, however, the material by which to form the side margin parts 104 and cover parts 105 is not limited to an alkali niobate piezoelectric ceramic and any material can be used so long as it has high insulation property.

Also, in the side margin parts 104 and cover parts 105, preferably Ag is uniformly diffused in the internal electrodes 102 in which it is contained, just like in the piezoelectric ceramic layers 106. This assures high electrical resistance of the side margin parts 104 and cover parts 105, while reducing the internal stress in the laminated piezoelectric element 100.

[Method of Manufacturing Piezoelectric Element 10 and Laminated Piezoelectric Element 100]

The following describes in a more specific manner the methods of manufacturing the piezoelectric element 10 shown in FIG. 1 and the laminated piezoelectric element 100 shown n FIGS. 2 to 4.

(Production of Tentatively Sintered Powder Mixture of Alkali Niobate Piezoelectric Ceramic)

To produce the tentatively sintered powder mixture of alkali niobate piezoelectric ceramic used in the manufacture of the piezoelectric element 10 and laminated piezoelectric element 100, a material containing K, a material containing Na, a material containing Li, a material containing Nb, a material containing Ta, and a material containing Sb, may be used.

For the material containing K, potassium carbonate ($K_2CO_3$) or potassium hydrogen carbonate ($KHCO_3$) may be used, for example.

For the material containing Na, sodium carbonate ($Na_2CO_3$) or sodium hydrogen carbonate ($NaHCO_3$) may be used, for example.

For the material containing Li, lithium carbonate ($Li_2CO_3$) may be used, for example.

For the material containing Nb, niobium pentoxide ($Nb_2O_5$) may be used, for example.

For the material containing Ta, tantalum pentoxide ($Ta_2O_5$) may be used, for example.

For the material containing Sb, antimony trioxide ($Sb_2O_3$) may be used, for example.

After the above materials have been prepared, they are weighed to a specified composition. Then, these materials are wet-agitated for 10 to 60 hours in a ball mill containing partially stabilized zirconium (PSZ) balls and ethanol or other organic solvent as the dispersion medium, after which the organic solvent is volatilized and the remainder is dried, to obtain an agitated material. Then, the obtained agitated material is tentatively sintered for 1 to 10 hours at a temperature of 700 to 950° C., and then crushed in a ball mill to obtain a tentatively sintered powder.

For the additive containing alkali earth metal M2, an additive containing at least one of Ca, Ba, and Sr is used.

For the additive containing Ca, calcium carbonate ($CaCO_3$) may be used, for example.

For the additive containing Ba, barium carbonate ($BaCO_3$) may be used, for example.

For the additive containing Sr, strontium carbonate ($SrCO_3$) may be used, for example.

Additives containing an element other than alkali earth metal M2 are also used as deemed appropriate. For these additives, an additive containing Mn, an additive containing Li, and an additive containing Si, may be used, for example. The additive of each element may be constituted by one type of additive, or by a combination of two or more types of additives.

For the additive containing Mn, manganese carbonate ($MnCO_3$), manganese monoxide (MnO), manganese dioxide ($MnO_2$), trimanganese tetroxide ($Mn_3O_4$), or manganese acetate ($Mn(OCOCH_3)_2$) may be used, for example.

For the additive containing Si, silicon dioxide ($SiO_2$) may be used, for example.

Also, additives containing multiple types of metal atoms can be used. For example, lithium metasilicate ($Li_2SiO_3$), lithium orthosilicate ($Li_4SiO_4$), etc., may be used as an additive containing Li and Si. Also, calcium metasilicate ($CaSiO_3$), calcium orthosilicate ($Ca_2SiO_4$), etc., may be used as an additive containing Ca and Si.

Then, the tentatively sintered powder and various additives obtained above are wet-agitated for 10 to 60 hours in a ball mill containing PSZ balls and ethanol or other organic solvent as the dispersion medium, after which the organic solvent is volatilized and the remainder is dried, to obtain a tentatively sintered powder mixture.

(Method of Manufacturing Piezoelectric Element 10)

The following explains the method of manufacturing the piezoelectric element 10 shown in FIG. 1.

First, the granulation step is performed. The granulation step is a step where the tentatively sintered powder mixture produced above is kneaded and mixed with an organic binder to achieve moldability. To knead and mix a primarily ceramic powder with an organic binder thoroughly and evenly, is called "granulation." Here, various options are available for the organic binder to be kneaded and mixed, such as polyvinyl alcohol, polyvinyl butyral, and ethyl cellulose.

Next, the molding step is performed. The molding step is a step where the ceramic powder that has been granulated in the granulation step is filled in a die having any of various shapes and then pressure is applied to it using a single-axis press machine, hydrostatic machine, etc., to obtain an unsintered molded product having a desired shape. Here, the ceramic powder is molded so as to achieve a density of roughly 60 percent of the ideal density of the applicable ceramic.

Next, the sintering step is performed. In the sintering step, the molded product obtained in the molding step is sintered. The sintering may be performed with each molded product housed in a sheath made of alumina, for example.

The sintering step consists of binder removal and sintering. The binder removal involves keeping each molded product at a temperature of 300 to 500° C. to vaporize and thereby remove the binder component in the molded product. And, in the sintering after binder removal, the molded product is kept at a temperature of 900 to 1200° C. in ambient atmosphere. This way, the piezoelectric ceramic layer 11 shown in FIG. 1 is obtained.

Thereafter, the external electrode-forming step is performed. In the external electrode-forming step, the piezoelectric ceramic layer 11 obtained in the sintering step is coated with a conducive paste whose primary component is Ag, and then baked at 750 to 850° C., to form the electrodes 12a, 12b shown n FIG. 1. This way, the piezoelectric element 10 shown in FIG. 1 is obtained.

The forming method of the electrodes 12a, 12b is not limited to baking of conductive paste, and the thin film forming method by means of sputtering or vacuum deposition may also be used, for example. Also, for the conductive paste, any conductive paste whose primary component is other than Ag, such as Al, Fe, Ni, Cu, Ga, Nb, Pd, In, Sn, W, Pt, Au, or Bi, may be used.

Furthermore, the electrodes 12a, 12b whose primary component is any of these elements may be formed by a method other than baking, such as the sputtering method, vacuum deposition method, electroless plating method, electrolytic plating method, or the like, for example. Additionally, the electrodes 12a, 12b may use two or more of these elements in combination, and may also be formed as multiple layers.

(Method of Manufacturing Laminated Piezoelectric Element 100)

The following explains the method of manufacturing the laminated piezoelectric element 100 shown in FIGS. 2 to 4.

First, the unsintered sheet preparation step is performed. In the unsintered sheet preparation step, unsintered sheets (ceramic green sheets) 501, 505 are prepared. The unsintered sheets 501 correspond to the piezoelectric ceramic layers 106 and side margin parts 104 of the laminated piezoelectric element 100. The unsintered sheets 505 correspond to the cover parts 105 of the laminated piezoelectric element 100.

To obtain the unsintered sheets 501, first an organic binder, and a dispersant, are added to a tentatively sintered powder mixture of alkali niobate piezoelectric ceramic of basic composition, after which the mixture is wet-mixed in a ball mill. This way, a ceramic slurry is obtained. This ceramic slurry is formed into sheets using the doctor blade method, etc., to obtain the unsintered sheets 501.

The unsintered sheets 505 can also be produced in the same manner the unsintered sheets 501 are produced. The composition of the unsintered sheet 505 may be identical to the composition of the unsintered sheet 501, or different from the composition of the unsintered sheet 501. From the viewpoint of the percentage of shrinkage during sintering, etc., however, preferably the composition of the unsintered sheet 505 is identical or similar to the composition of the unsintered sheet 501.

The unsintered sheets 501, 505 do not contain Ag in this stage. This makes it easier for the Ag contained in the unsintered electrodes 502 to diffuse to the unsintered sheets 501, 505 during sintering. It should be noted that the unsintered sheets 501, 505 may contain Ag to the extent that the Ag contained in the unsintered electrodes 502 will diffuse to them in a favorable manner during sintering.

Next, the unsintered electrode printing step is performed. In the unsintered electrode printing step, unsintered electrodes 502 are patterned on the unsintered sheets 501 obtained in the unsintered sheet preparation step, in order to form internal electrodes 102. For the unsintered electrodes 502, a conductive paste containing Ag alone, or containing a metal component that contains Ag by 50 percent or more, may be used, for example. The unsintered electrodes 502 may be patterned using the screen printing method, for example.

Figure 6:
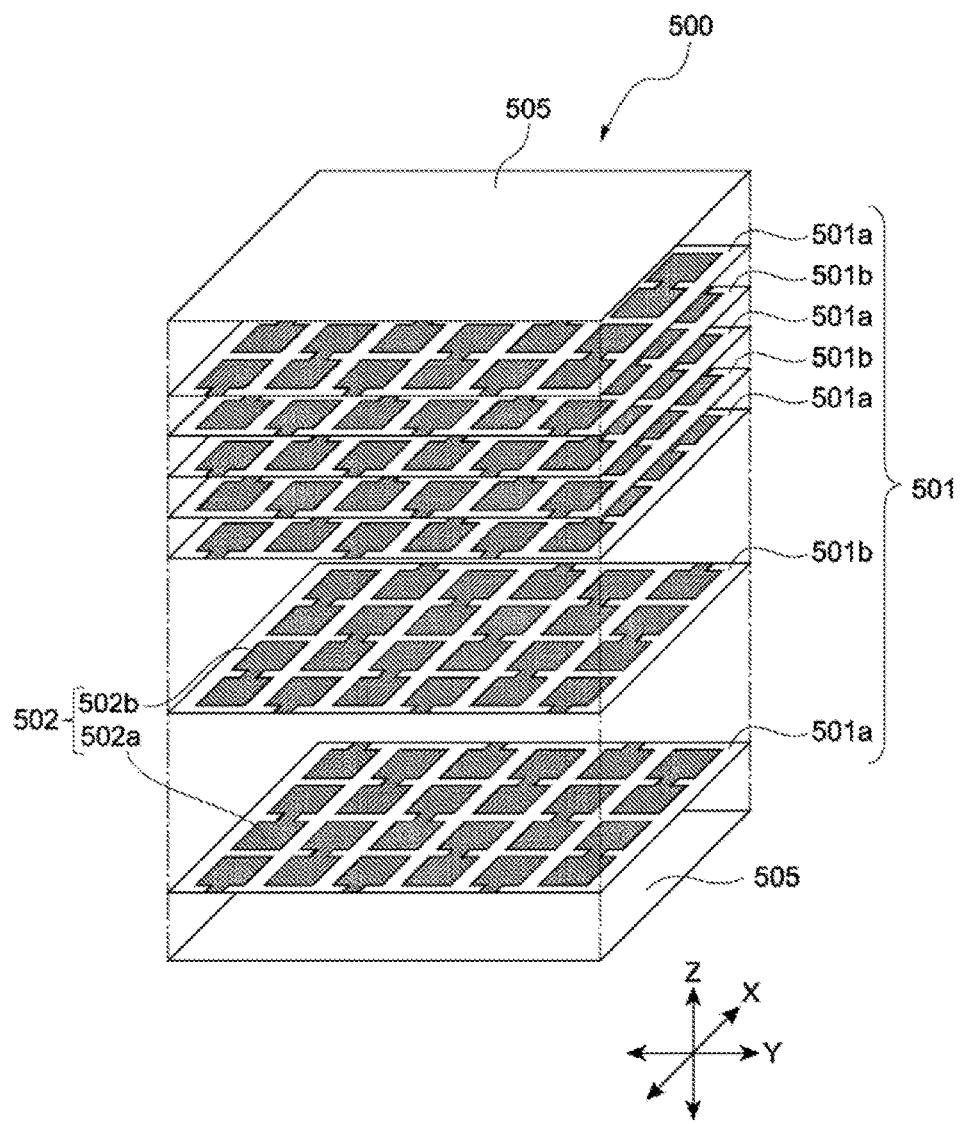
FIG. 6 is an Exploded perspective view showing a manufacturing process of the aforementioned laminated piezoelectric element.

As above, first unsintered sheets 501a on which first unsintered electrodes 502a corresponding to the first internal electrodes 102a are patterned, and second unsintered sheets 501b on which second unsintered electrodes 502b corresponding to the second internal electrodes 102b are patterned, are produced as unsintered sheets 501, as shown in FIG. 6. It should be noted that no unsintered electrodes 502 are provided on the unsintered sheets 505 corresponding to the cover parts 105.

Next, the lamination step is performed. In the lamination step, the unsintered sheets 501, 505 obtained in the unsintered sheet preparation step and unsintered electrode printing step are stacked together.

To be specific, the first unsintered sheets 501a on which the first unsintered electrodes 502a have been patterned are stacked alternately with the second unsintered sheets 501b on which the second unsintered electrodes 502b have been patterned, as shown in FIG. 6. Also, the unsintered sheets 505 are placed as the topmost layer and bottommost layer of the unsintered sheets 501 in the Z-axis direction. The unsintered sheets 505 to be placed may each comprise multiple sheets.

By pressure-bonding the unsintered sheets 501, 505 stacked together in the lamination step, a laminate 500 is obtained. It should be noted that FIG. 6 shows the laminate 500 by breaking it down into the respective unsintered sheets 501, 505 for the purpose of explanation. Then, the laminate 500 is diced or otherwise cut into individual pieces of laminated piezoelectric elements 100.

Thereafter, the sintering step is performed. In the sintering step, the individual pieces of laminates 500 are sintered. The sintering may be performed with each laminate 500 housed in a sheath made of alumina, for example.

The sintering step consists of binder removal and sintering. The binder removal involves keeping each laminate 500 at a temperature of 300 to 500° C. to vaporize and thereby remove the binder component in the laminate 500. And, in the sintering after binder removal, the laminate is kept at a temperature of 900 to 1200° C. in ambient atmosphere. This way, the element body 101 shown in FIGS. 1 to 3 is obtained.

In the sintering step, the unsintered sheets 501, 505 and unsintered electrodes 502 are sintered, while the Ag contained in the unsintered electrodes 502 (internal electrodes 102) diffuses uniformly to the unsintered sheets 501, 505 (piezoelectric ceramic layers 106, side margin parts 104 and cover parts 105).

Thereafter, the external electrode forming step is performed. In the external electrode forming step, the element body 101 obtained in the sintering step is coated with a conductive paste whose primary component is Ag, and then baked at 750 to 850° C., to form the external electrodes 103 shown in FIGS. 2 and 3. This way, the laminated piezoelectric element 100 shown in FIGS. 2 to 4 is obtained.

The forming method of the external electrodes 103 is not limited to baking of conductive paste, and the thin film forming method by means of sputtering or vacuum deposition may also be used, for example. Also, for the conductive paste, any conductive paste whose primary component is other than Ag, such as Al, Fe, Ni, Cu, Ga, Nb, Pd, In, Sn, W, Pt, Au, or Bi, may be used.

Furthermore, the external electrodes 103 whose primary component is any of these elements may be formed by a method other than baking, such as the sputtering method, vacuum deposition method, electroless plating method, electrolytic plating method, or the like, for example. Additionally, the external electrodes 103 may use two or more of these elements in combination, and may also be formed as multiple layers.

[Evaluation of Piezoelectric Element 10 and Laminated Piezoelectric Element 100]

(Ag Content)

Preferably Ag is uniformly diffused in the piezoelectric ceramic layer 11 of the piezoelectric element 10 and in the piezoelectric ceramic layer 106 of the laminated piezoelectric element 100 (the more uniformly the Ag is diffused the better). This way, a polycrystalline substance constituted by fine, uniform crystal is obtained to assure high electrical resistance of the piezoelectric ceramic layer 11 and piezoelectric ceramic layer 106, and consequently high reliability of the piezoelectric element 10 and laminated piezoelectric element 100 can be ensured.

The degree of dispersion of Ag in the piezoelectric ceramic layer 11 and piezoelectric ceramic layer 106 can be evaluated using the coefficient of variation CV in Ag content, for example. The coefficient of variation CV in the Ag content in the piezoelectric ceramic layer 11 and piezoelectric ceramic layer 106 can be calculated, for example, using the Ag contents measured at various positions in the piezoelectric ceramic layer 11 and piezoelectric ceramic layer 106. To be specific, coefficient of variation CV in Ag content is obtained by Mathematical Formula (A) below using the arithmetic mean α and standard deviation σ of Ag contents.

[Mathematical Formula 1]

$$CV = \frac{\sqrt{\sigma^2}}{\alpha} \quad (A)$$

Preferably the coefficient of variation CV in the Ag content in the piezoelectric ceramic layer 11 and piezoelectric ceramic layer 106 is 20 percent or less. If so, favorable diffusion behavior of Ag is obtained when the piezoelectric element 10 and laminated piezoelectric element 100 are sintered, to assure high electrical resistance of the piezoelectric ceramic layer 11 and piezoelectric ceramic layer 106 in a more reliable manner. The distribution of Ag in the piezoelectric ceramic layer 11 and piezoelectric ceramic layer 106 can be adjusted, for example, by manipulating the sintering temperature and sintering time of the piezoelectric element 10 and laminated piezoelectric element 100, or the like.

Also, with the laminated piezoelectric element 100, preferably the coefficient of variation CV in the Ag content in the side margin parts 104 and cover parts 105 is 20 percent or less, as in the piezoelectric ceramic layers 106. If so, high electrical resistance of the side margin parts 104 and cover parts 105 is assured in a more reliable manner. The distribution of Ag in the side margin parts 104 and cover parts 105 can be adjusted, for example, by manipulating the sintering temperature and sintering time of the laminated piezoelectric element 100, or the like.

The measuring method of Ag content at each position in the piezoelectric ceramic layer 11, piezoelectric ceramic layers 106, side margin parts 104, and cover parts 105 is not limited to any specific method.

For the measurement of Ag content, energy dispersive X-ray spectrometry (EDS), wavelength dispersive X-ray spectrometry (WDS), secondary ion mass spectrometry (SIMS), Auger electron spectroscopy (AES), X-ray photoelectron spectroscopy (XPS), etc., can be used, for example.

For the samples used to measure Ag content, randomly selected cut sections of the piezoelectric element 10 and laminated piezoelectric element 100, which have been processed so that the structures of the polycrystalline substance can be observed, may be used, for example. These samples, which are sections of the piezoelectric element 10 and laminated piezoelectric element 100, for example, can be made observable by mirror-polishing them using a diamond paste, etc., to achieve enough smoothness for measurement.

(Crystal Grain Size)

The piezoelectric ceramic layer 11 and piezoelectric ceramic layer 106 may be measured for crystal grain size by observing the structures of the sections of the piezoelectric element 10 and laminated piezoelectric element 100 using a SEM, etc., for example. For the samples used to measure the crystal grain size of the piezoelectric ceramic layer 11 and piezoelectric ceramic layer 106, sections of the piezoelectric element 10 and laminated piezoelectric element 100 which have been mirror-polished and then etched further can be used, just like the samples used to measure Ag content.

For the etching of the sections of the piezoelectric element 10 and laminated piezoelectric element 100, thermal etching that involves heating can be used, for example. Alternatively, chemical etching can be used, which uses hydrofluoric acid, hydrochloric acid, sulfuric acid, nitric acid, etc., or an acid mixture constituted by the foregoing, with its concentration adjusted to a level appropriate for etching.

The crystal grain size of the piezoelectric ceramic layer 11 and piezoelectric ceramic layer 106 can be determined by a photographic method using photographs of the etched sections of the piezoelectric element 10 and laminated piezoelectric element 100 taken by a SEM, etc., for example. Under the photographic method, a desired number of mutually parallel straight lines are drawn on a photograph of a randomly selected section of the piezoelectric element 10 or laminated piezoelectric element 100, and the length of each crystal crossed by these straight lines is used as the crystal grain size. For example, highly reliable data can be obtained by obtaining the crystal grain sizes of 400 or more crystals for each sample and evaluating the obtained crystal grain sizes.

The crystal grain size of the piezoelectric ceramic layer 11 and piezoelectric ceramic layer 106 can be evaluated using the 10% grain size D10, 50% grain size D50, and 90% grain size D90, corresponding to the cumulative percentages of 10 percent, 50 percent, and 90 percent in the cumulative distribution of crystal grain sizes, respectively, for example. To be more specific, the distribution of crystal grain sizes may be evaluated using the value calculated by (D90−D10)/D50 using the values of D10, D50, and D90.

Here, to obtain the 10% grain size D10, 50% grain size D50, and 90% grain size D90, the crystal grain sizes of 400 or more crystals obtained by the aforementioned photographic method may be used. To be specific, the obtained crystal grain sizes are counted from the smallest size and when the count first reaches 10 percent of the total number, the applicable crystal grain size is used as the 10% grain size D10; when the count first reaches 50 percent of the total number, the applicable crystal grain size is used as the 50% grain size D50; and when the count first reaches 90 percent of the total number, the applicable crystal grain size is used as the 90% grain size D90.

With the piezoelectric ceramic layer 11 and piezoelectric ceramic layer 106 pertaining to this embodiment, preferably the 50% grain size D50 satisfies "100 nm≤D50≤800 nm." By keeping the D50 to 800 nm or less, the piezoelectric ceramic layer 11 and piezoelectric ceramic layer 106 are constituted by a very fine polycrystalline substance and therefore high electrical resistance is obtained at the piezoelectric ceramic layer 11 and piezoelectric ceramic layer 106. On the other hand, keeping the D50 to 100 nm or more reduces the effect of stress generating at the grain boundaries of the crystal, and consequently good piezoelectric property of the piezoelectric ceramic layer 11 and piezoelectric ceramic layer 106 can be ensured.

In addition, more preferably the D50 is 200 nm or more.

Also, with the piezoelectric ceramic layer 11 and piezoelectric ceramic layer 106 pertaining to this embodiment, preferably "(D90−D10)/D50≤2.0" is satisfied. This gives a polycrystalline substance of uniform crystal grain size, and high electrical resistance of the piezoelectric ceramic layer 11 and piezoelectric ceramic layer 106 is assured in a more reliable manner.

Constituting the piezoelectric ceramic layer 11 and piezoelectric ceramic layer 106 by a fine, uniform polycrystalline substance assures high electrical resistance even when the piezoelectric ceramic layer 11 and piezoelectric ceramic layer 106 are made thinner, and consequently high reliability of the piezoelectric element 10 and laminated piezoelectric element 100 can be ensured. This means that, with this constitution, reliability can be ensured even when the size is reduced. Also, further size reduction of the piezoelectric element 10 and laminated piezoelectric element 100 improves their mass-producibility.

Furthermore, with the laminated piezoelectric element 100, the number of piezoelectric ceramic layers 106 can be increased without increasing the element size, because the piezoelectric ceramic layers 106 can be made thinner. As a result, the laminated piezoelectric element 100 can achieve a substantial improvement in the amount of displacement.

(Reliability)

The reliability of the piezoelectric element 10 and laminated piezoelectric element 100 can be evaluated in the form of electrical resistivity ρ (Ω·cm), for example. The electrical resistivity ρ can be converted from the voltage and current obtained after applying an electric field of 8 kV/mm or so for 5 minutes at 100° C., for example. Preferably the laminated piezoelectric element 100 has an electrical resistivity ρ of $1.0 \times 10^8$ Ω·cm or more.

(Piezoelectric Characteristics)

The piezoelectric characteristics of the piezoelectric element 10 and laminated piezoelectric element 100 can be evaluated in the form of displacement amount $d^*_{33}$ (pm/V), for example. The displacement amount $d^*_{33}$ of the piezoelectric element 10 and laminated piezoelectric element 100 can be measured using a laser Doppler displacement gauge, for example.

In the measurement using a laser Doppler displacement gauge, for example, monopolar sine waveforms that give the maximum electric field of 8 kV/mm at approx. 100 Hz are driven into the piezoelectric element 10 and laminated piezoelectric element 100, and the displacement amount of the piezoelectric element 10 and laminated piezoelectric element 100 is measured. Thereafter, the displacement amount $d^*_{33}$ per unit voltage in one layer can be calculated as the quotient obtained by dividing the displacement amount of the piezoelectric element 10 and laminated piezoelectric element 100 by the number of layers between the electrodes and the maximum voltage. Preferably the piezoelectric element 10 and laminated piezoelectric element 100 have a displacement amount $d^*_{33}$ of 140 pm/V or more.

Example 1

In Example 1, the laminated piezoelectric element 100 pertaining to the aforementioned embodiment was evaluated for Ag distribution in the piezoelectric ceramic layers 106, side margin parts 104, and cover parts 105.

The evaluated laminated piezoelectric element 100 was a sample corresponding to Sample A02 described later. To expose a section of the laminated piezoelectric element 100, first the element was immersed in water and polished gradually using abrasive papers of sizes 500 to 3000, to achieve a smooth surface. Thereafter, a 1-um diamond paste was used to mirror-polish the surface to achieve enough smoothness for measurement, before conducting observation and evaluation.

(Piezoelectric Ceramic Layer 106)

Figure 7:
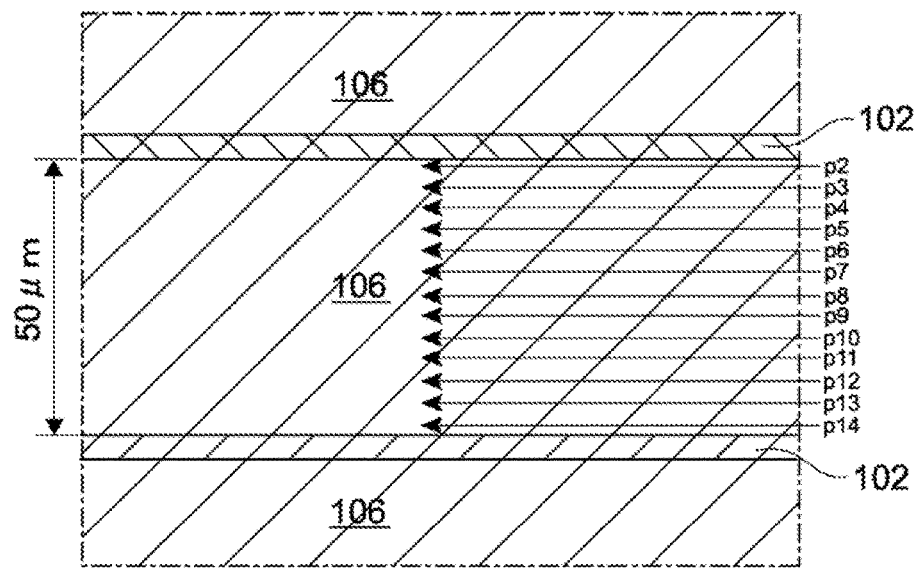
FIG. 7 is a Drawing showing where to measure the Ag content in the piezoelectric ceramic layer of the aforementioned laminated piezoelectric element.

FIG. 7 is a drawing explaining the distribution of Ag content in the thickness direction of the piezoelectric ceramic layer 106 of the laminated piezoelectric element 100 pertaining to the aforementioned embodiment. As shown in FIG. 7, the contents of Ag, K, Na, and Nb were measured at the 13 positions of p2 to p14 in one piezoelectric ceramic layer 106 between the internal electrodes 102. The thickness of the piezoelectric ceramic layer 106 was 50 μm.

To be more specific, the evaluation was performed using the energy dispersive X-ray spectrums (EDSs) obtained by a silicon drift energy dispersive X-ray detector (Apollo, manufactured by AMETEK) installed on a field emission scanning electron microscope (FE-SEM: S-4300, manufactured by Hitachi High Technologies). The measurement voltage was 10 kV, and the Ag-L, K—K, Na—K, and Nb-L spectrums were evaluated quantitatively. Each spectrum was corrected for atomic number, absorption, and fluorescence (ZAF correction), and the content of each element was evaluated.

The contents of Ag, K, and Na at each position are shown as mol ratios at site A in Composition Formula (1) where the Nb content at site B in Composition Formula (1) represents a mol ratio of 100 percent. In many cases the contents of Ag, K, and Na do not fully match the compounding conditions of the composition, because the observed absolute values vary depending on the measurement method.

Under this measurement, mol ratios are calculated at the respective measurement locations and the results are used to evaluate the statistical variations, such as the arithmetic mean α, standard deviation σ, and coefficient of variation CV, at the measurement locations. Accordingly, discrepancy in absolute value is not a problem under this measurement because of extending time sufficiently for the measurements taken at each position until the values become sufficiently reliable. Under this measurement, measuring time is sufficiently extended so that the line intensity of the K—K spectrum, among the EDSs, becomes 5000 count or more.

In FIG. 7, the positions p2 to p14 in the piezoelectric ceramic layer 106 represent the locations where the contents of the site A elements Ag, K, and Na were evaluated using the EDSs, relative to the Nb content being 100 percent by mol, as described above.

Table 1 shows the calculated results of arithmetic mean α, standard deviation σ, and coefficient of variation CV of the contents of Ag, K, and Na at the positions p2 to p14 in the piezoelectric ceramic layer 106.

TABLE 1

| Measurement location in FIG. 7 | Contents of site A elements (Ag, K, Na) relative to Nb content being 100 percent by mol (mol %) | | | |
|---|---|---|---|---|
| | Ag (mol %) | K (mol %) | Na (mol %) | Nb (mol %) |
| p2 | 1.54 | 37.85 | 47.71 | 100 |
| p3 | 1.10 | 29.41 | 113.38 | 100 |
| p4 | 1.27 | 28.80 | 117.95 | 100 |
| p5 | 1.33 | 37.61 | 47.67 | 100 |
| p6 | 0.95 | 32.83 | 78.99 | 100 |
| p7 | 1.20 | 32.34 | 77.84 | 100 |
| p8 | 1.36 | 29.90 | 59.00 | 100 |
| p9 | 1.30 | 37.89 | 45.41 | 100 |
| p10 | 1.26 | 32.90 | 77.05 | 100 |
| p11 | 1.33 | 31.71 | 78.84 | 100 |
| p12 | 1.35 | 31.01 | 79.17 | 100 |
| p13 | 1.44 | 32.87 | 77.83 | 100 |
| p14 | 0.87 | 20.40 | 50.57 | 100 |
| Arithmetic mean α (%) | 1.25 | 31.96 | 73.19 | — |
| Standard deviation σ (%) | 0.19 | 4.65 | 23.39 | — |
| Coefficient of variance CV (%) | 14.91 | 14.55 | 31.96 | — |

As shown in Table 1, the coefficient of variation CV in the Ag content in the piezoelectric ceramic layer 106 is 14.91 percent, which is substantially below 20 percent. This suggests that favorable diffusion behavior of Ag, from the internal electrodes 102 to the piezoelectric ceramic layer 106, was obtained when the laminated piezoelectric element 100 was sintered.

Also, as is evident from Table 1 and FIG. 7, Ag is uniformly dispersed in the piezoelectric ceramic layer 106 in its thickness direction, just as are Na and K that are conformationally positioned at site A of the perovskite structure. In other words, the Ag contained in the internal electrodes 102 diffused uniformly to the piezoelectric ceramic layer 106 over its entire region in the thickness direction when the laminated piezoelectric element 100 was sintered.

(Side Margin Part 104)

Figure 8:
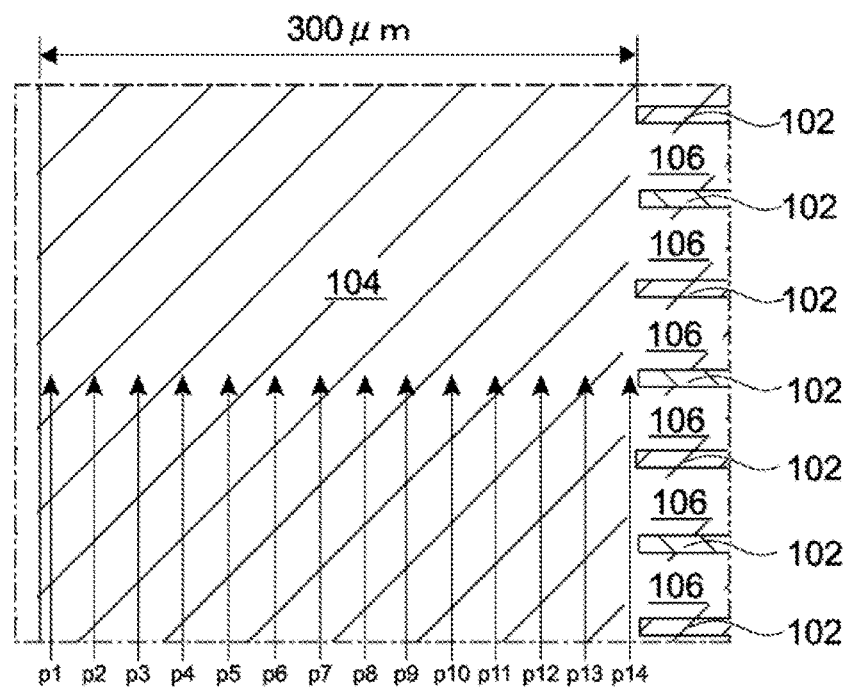
FIG. 8 is a Drawing showing where to measure the Ag content in the side margin part of the aforementioned laminated piezoelectric element.

FIG. 8 is a drawing explaining the distribution of Ag content in the width direction of the side margin part 104 of the laminated piezoelectric element 100 pertaining to the aforementioned embodiment. As shown in FIG. 8, the contents of Ag, K, Na, and Nb were measured at the 14 locations of the positions p1 to p14 in the side margin part 104 as arranged between the side face, and the ends of the internal electrodes 102, of the laminated piezoelectric element 100. The width of the side margin part 104 was 300 μm.

It should be noted that the measurement method, measurement conditions, content evaluation method, and points to note, are the same as those described above with respect to the piezoelectric ceramic layer 106.

In FIG. 8, the positions p1 to p14 in the side margin part 104 represent the locations where the contents of site A elements Ag, K, and Na were evaluated using the EDSs, relative to the Nb content being 100 percent by mol, as described above.

Table 2 shows the calculated results of arithmetic mean α, standard deviation σ, and coefficient of variation CV of the contents of Ag, K, and Na in the side margin part 104.

TABLE 2

| Measurement location in FIG. 8 | Contents of site A elements (Ag, K, Na) relative to Nb content being 100 percent by mol (mol %) | | | |
|---|---|---|---|---|
| | Ag (mol %) | K (mol %) | Na (mol %) | Nb (mol %) |
| p1 | 1.54 | 37.50 | 46.70 | 100 |
| p2 | 1.38 | 31.25 | 78.91 | 100 |
| p3 | 1.21 | 30.64 | 79.30 | 100 |
| p4 | 1.19 | 31.47 | 73.74 | 100 |
| p5 | 1.38 | 32.57 | 74.19 | 100 |
| p6 | 1.31 | 31.12 | 68.34 | 100 |
| p7 | 1.32 | 32.56 | 77.45 | 100 |
| p8 | 1.12 | 31.86 | 75.72 | 100 |
| p9 | 1.22 | 31.60 | 77.70 | 100 |
| p10 | 1.26 | 33.22 | 75.95 | 100 |
| p11 | 1.28 | 30.99 | 82.97 | 100 |
| p12 | 1.22 | 32.48 | 77.44 | 100 |
| p13 | 0.77 | 15.83 | 41.61 | 100 |
| p14 | 1.17 | 32.14 | 76.84 | 100 |
| Arithmetic mean α (%) | 1.24 | 31.09 | 71.92 | — |
| Standard deviation σ (%) | 0.17 | 4.70 | 12.25 | — |
| Coefficient of variance CV (%) | 13.99 | 15.12 | 17.03 | — |

As shown in Table 2, the coefficient of variation CV in the Ag content in the side margin part 104 is 13.99 percent, which is substantially below 20 percent. This suggests that favorable diffusion behavior of Ag, from the internal electrodes 102 to the side margin part 104, was obtained when the laminated piezoelectric element 100 was sintered.

Also, as is evident from Table 2 and FIG. 8, Ag is uniformly dispersed in the side margin part 104 in its width direction, just as are Na and K that are conformationally positioned at site A of the perovskite structure. In other words, the Ag contained in the internal electrodes 102 diffused uniformly to the side margin part 104 over its entire region in the width direction when the laminated piezoelectric element 100 was sintered.

(Cover Part 105)

Figure 9:
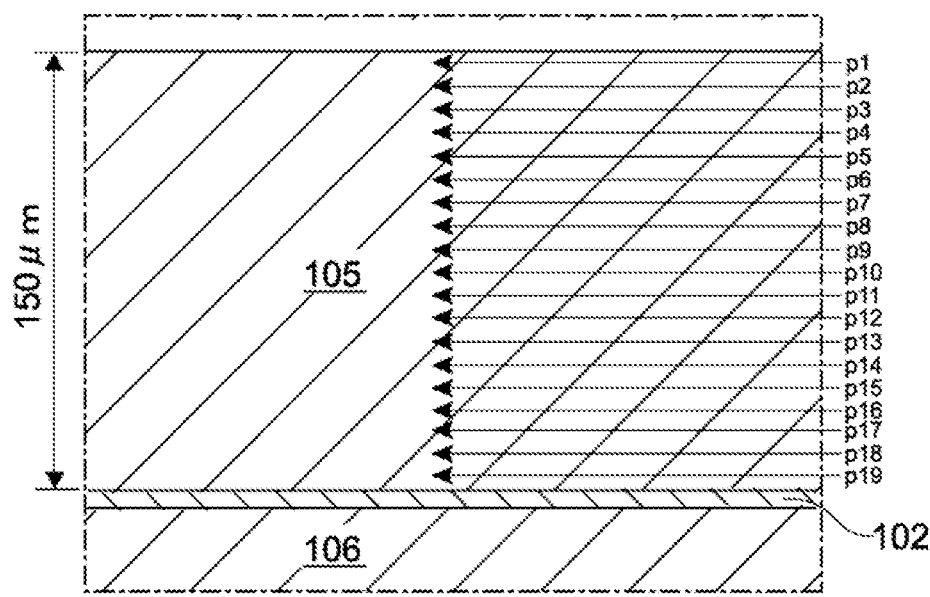
FIG. 9 is a Drawing showing where to measure the Ag content in the cover part of the aforementioned laminated piezoelectric element.

FIG. 9 is a drawing explaining the distribution of Ag content in the thickness direction of the cover part 105 of the laminated piezoelectric element 100 pertaining to the aforementioned embodiment. As shown in FIG. 9, the contents of Ag, K, Na, and Nb were measured at the 19 locations of the positions p1 to p19 in the cover part 105 as arranged between the top face, and the internal electrodes 102, of the laminated piezoelectric element 100. The thickness of the cover part 105 was 150 μm.

It should be noted that the measurement method, measurement conditions, content evaluation method, and points to note, are the same as those described above with respect to the piezoelectric ceramic layer 106.

In FIG. 9, the positions p1 to p19 in the cover part 105 represent the locations where the contents of site A elements Ag, K, and Na were evaluated using the EDSs, relative to the Nb content being 100 percent by mol, as described above.

Table 3 shows the calculated results of arithmetic mean α, standard deviation σ, and coefficient of variation CV of the contents of Ag, K, and Na in the cover part 105.

TABLE 3

| Measurement location in FIG. 9 | Contents of site A elements (Ag, K, Na) relative to Nb content being 100 percent by mol (mol %) | | | |
|---|---|---|---|---|
|  | Ag (mol %) | K (mol %) | Na (mol %) | Nb (mol %) |
| p1  | 1.26 | 40.83 | 45.19 | 100 |
| p2  | 1.23 | 31.83 | 78.22 | 100 |
| p3  | 1.27 | 31.93 | 79.21 | 100 |
| p4  | 1.16 | 31.90 | 78.88 | 100 |
| p5  | 1.11 | 32.33 | 76.44 | 100 |
| p6  | 1.30 | 26.25 | 51.21 | 100 |
| p7  | 1.28 | 33.28 | 79.67 | 100 |
| p8  | 1.10 | 31.46 | 79.84 | 100 |
| p9  | 1.12 | 31.29 | 78.25 | 100 |
| p10 | 1.38 | 33.30 | 75.58 | 100 |
| p11 | 1.15 | 32.29 | 77.03 | 100 |
| p12 | 1.37 | 32.88 | 76.45 | 100 |
| p13 | 1.17 | 32.74 | 76.75 | 100 |
| p14 | 0.96 | 32.01 | 75.75 | 100 |
| p15 | 1.38 | 31.38 | 76.39 | 100 |
| p16 | 1.38 | 31.40 | 78.97 | 100 |
| p17 | 1.32 | 32.51 | 77.50 | 100 |
| p18 | 1.49 | 33.17 | 76.69 | 100 |
| p19 | 1.50 | 31.75 | 78.22 | 100 |
| Arithmetic mean α (%) | 1.26 | 32.34 | 74.54 | — |
| Standard deviation σ (%) | 0.14 | 2.55 | 9.43 | — |
| Coefficient of variance CV (%) | 11.23 | 7.88 | 12.65 | — |

As shown in Table 3, the coefficient of variation CV in the Ag content in the cover part 105 is 11.23 percent, which is substantially below 20 percent. This suggests that favorable diffusion behavior of Ag, from the internal electrodes 102 to the cover part 105, was obtained when the laminated piezoelectric element 100 was sintered.

Also, as is evident from Table 3 and FIG. 9, Ag is uniformly dispersed in the cover part 105 in its thickness direction, just as are Na and K that are conformationally positioned at site A of the perovskite structure. In other words, the Ag contained in the internal electrodes 102 diffused uniformly to the cover part 105 over its entire region in the thickness direction when the laminated piezoelectric element 100 was sintered.

Example 2

In Example 2, a tentatively sintered powder of alkali niobate piezoelectric ceramic was prepared based on a composition of $Li_{0.064}Na_{0.52}K_{0.42}NbO_3$, and by changing the different internal electrodes 102 and additives, Samples P01, A01, and A02 of the laminated piezoelectric element 100 were produced. Table 4 shows the types and quantities of additives in Samples P01, A01, and A02. The quantities of additives shown in Table 4 represent the equivalent quantities of the respective additives in percent by mol, relative to 100 percent by mol of the alkali niobate piezoelectric ceramic of $Li_{0.064}Na_{0.52}K_{0.42}NbO_3$.

Table 4 follows:

TABLE 4

| Sample no. | Electrode type | Composition of tentatively sintered powder | Additives (Added further to 100 percent by mol of tentatively sintered powder) |
|---|---|---|---|
| P01 | Pd | $Li_{0.064}Na_{0.52}K_{0.42}NbO_3$ | 0.5 mol % $SrCO_3$, 0.65 mol % $Li_2O$, 1.3 mol % $SiO_2$, 0.5 mol % MnO |
| A01 | $Ag_{0.7}Pd_{0.3}$ | $Li_{0.064}Na_{0.52}K_{0.42}NbO_3$ | 0.65 mol % $Li_2O$, 1.3 mol % $SiO_2$, 0.5 mol % MnO |
| A02 | $Ag_{0.7}Pd_{0.3}$ | $Li_{0.064}Na_{0.52}K_{0.42}NbO_3$ | 0.5 mol % $SrCO_3$, 0.65 mol % $Li_2O$, 1.3 mol % $SiO_2$, 0.5 mol % MnO |

As shown in Table 4, Sample P01 is different from the constitution of the aforementioned embodiment in that the internal electrodes 102 do not contain Ag but are constituted only by Pd instead. Sample A01 is different from the constitution of the aforementioned embodiment in that no additive containing alkali earth metal M2 is added. Sample A02 has the constitution of the laminated piezoelectric element 100 pertaining to the aforementioned embodiment. In other words, Sample A02 is an example of the present invention, while Samples P01 and A01 are comparative examples of the present invention.

Unsintered sheets 501, 505 of 80 μm in thickness were obtained using the tentatively sintered powder mixtures of Samples P01, A01, and A02. Next, a conductive paste corresponding to the internal electrodes 102 shown in Table 4 was used to create patterns on the unsintered sheets 501 as unsintered electrodes 502. Then, the unsintered sheets 501, 505 were stacked together and approx. 50 MPa of pressure was applied, to obtain a laminate 500.

The laminate 500 was cut into individual pieces, which were then put through the binder removal step and sintering step, to obtain element bodies 101. A conductive paste was baked at 800° C. on the element bodies 101 to form external electrodes 103, to obtain Samples P01, A01, and A02 of the laminated piezoelectric element 100. Samples P01, A01, and A02 were polarized in a thermostatic chamber of 100° C. by applying an electric field of 3.0 kV/mm for 15 minutes.

The aforementioned method was used to obtain the D50 (nm) and (D90–D10)/D50 in the piezoelectric ceramic layer 106, for Samples P01, A01, and A02 of the laminated piezoelectric element 100 thus prepared. Table 5 shows the sintering temperature, D50 and (D90–D10)/D50 of Samples P01, A01 and A02.

TABLE 5

| Sample no. | Sintering temperature (° C.) | D50 (nm) | (D90–D10)/D50 |
|---|---|---|---|
| P01 | 950 | 1600 | 5.4 |
| A01 | 1000 | 2800 | 4.2 |
| A02 | 1100 | 460 | 0.96 |

As shown in Table 5, Sample A02 pertaining to the example of the present invention has a D50 of 460 nm, satisfying "100 nm≤D50≤800 nm." Also, Sample A02 has a (D90–D10)/D50 of 0.96, substantially below 2.0. This indicates that the polycrystalline substance constituting the piezoelectric ceramic layers 106 in Sample A02 is fine and uniform.

With Samples P01 and A01 pertaining to the comparative examples of the present invention, on the other hand, the D50 is substantially above 800 nm and the (D90–D10)/D50 is substantially above 2.0. With Sample P01, where the internal electrodes 102 did not contain Ag, probably fine crystal was not obtained for the piezoelectric ceramic layers 106 because of the resulting lack of a crystal refinement effect obtained by diffusion of Ag. With Sample A01, which did not contain alkali earth metal M2, the crystal probably became coarser as Ag diffused in the piezoelectric ceramic layers 106.

Example 3

In Example 3, Samples A02 to A20 of the laminated piezoelectric element 100, produced by changing the tentatively sintered powder composition and additives, were evaluated for performance. It should be noted that Sample A02 is the same as that in Example 2, and that $Ag_{0.7}Pd_{0.3}$ was used for the internal electrodes 102 of Samples A02 to A20. Table 6 shows the tentatively sintered powder compositions of, and the types and quantities of the additives in, Samples A02 to A20.

Table 6 follows:

TABLE 6

| Sample no. | Electrode type | Composition of tentatively sintered powder | Additives (Added further to 100 percent by mol of tentatively sintered powder) |
|---|---|---|---|
| A02 | $Ag_{0.7}Pd_{0.3}$ | $Li_{0.064}Na_{0.52}K_{0.42}NbO_3$ | 0.5 mol % $SrCO_3$, 0.65 mol % $Li_2O$, 1.3 mol % $SiO_2$, 0.5 mol % MnO |
| A03 | $Ag_{0.7}Pd_{0.3}$ | $Li_{0.064}Na_{0.52}K_{0.42}NbO_3$ | 0.2 mol % $SrCO_3$ |
| A04 | $Ag_{0.7}Pd_{0.3}$ | $Li_{0.064}Na_{0.52}K_{0.42}NbO_3$ | 0.3 mol % $SrCO_3$ |
| A05 | $Ag_{0.7}Pd_{0.3}$ | $Li_{0.064}Na_{0.52}K_{0.42}NbO_3$ | 1.0 mol % $SrCO_3$ |
| A06 | $Ag_{0.7}Pd_{0.3}$ | $Li_{0.064}Na_{0.52}K_{0.42}NbO_3$ | 5.0 mol % $SrCO_3$ |
| A07 | $Ag_{0.7}Pd_{0.3}$ | $Li_{0.064}Na_{0.52}K_{0.42}NbO_3$ | 0.5 mol % $SrCO_3$, 0.1 mol % MnO |
| A08 | $Ag_{0.7}Pd_{0.3}$ | $Li_{0.064}Na_{0.52}K_{0.42}NbO_3$ | 0.5 mol % $SrCO_3$, 0.5 mol % MnO |
| A09 | $Ag_{0.7}Pd_{0.3}$ | $Li_{0.064}Na_{0.52}K_{0.42}NbO_3$ | 0.5 mol % $SrCO_3$, 2.0 mol % MnO |
| A10 | $Ag_{0.7}Pd_{0.3}$ | $Li_{0.064}Na_{0.52}K_{0.42}NbO_3$ | 0.5 mol % $SrCO_3$, 0.1 mol % $Li_2O$, 0.1 mol % $SiO_2$, 0.5 mol % MnO |
| A11 | $Ag_{0.7}Pd_{0.3}$ | $Li_{0.064}Na_{0.52}K_{0.42}NbO_3$ | 0.5 mol % $SrCO_3$, 1.3 mol % $Li_2O$, 1.3 mol % $SiO_2$, 0.5 mol % MnO |
| A12 | $Ag_{0.7}Pd_{0.3}$ | $Li_{0.064}Na_{0.52}K_{0.42}NbO_3$ | 0.5 mol % $SrCO_3$, 0.4 mol % $Li_2O$, 1.3 mol % $SiO_2$, 0.5 mol % MnO |
| A13 | $Ag_{0.7}Pd_{0.3}$ | $Li_{0.064}Na_{0.52}K_{0.42}NbO_3$ | 0.5 mol % $SrCO_3$, 1.5 mol % $Li_2O$, 3.0 mol % $SiO_2$, 0.5 mol % MnO |
| A14 | $Ag_{0.7}Pd_{0.3}$ | $Li_{0.064}Na_{0.52}K_{0.42}NbO_3$ | 0.5 mol % $SrCO_3$, 0.65 mol % $Li_2O$, 1.3 mol % $SiO_2$, 2.0 mol % MnO |
| A15 | $Ag_{0.7}Pd_{0.3}$ | $Li_{0.066}Na_{0.52}K_{0.42}NbO_3$ | 0.5 mol % $SrCO_3$, 0.65 mol % $Li_2O$, 1.3 mol % $SiO_2$, 2.0 mol % MnO |
| A16 | $Ag_{0.7}Pd_{0.3}$ | $Li_{0.072}Na_{0.52}K_{0.42}NbO_3$ | 0.5 mol % $SrCO_3$, 0.65 mol % $Li_2O$, 1.3 mol % $SiO_2$, 2.0 mol % MnO |

TABLE 6-continued

| Sample no. | Electrode type | Composition of tentatively sintered powder | Additives (Added further to 100 percent by mol of tentatively sintered powder) |
|---|---|---|---|
| A17 | $Ag_{0.7}Pd_{0.3}$ | $Li_{0.064}Na_{0.52}K_{0.42}NbO_3$ | 0.5 mol % $CaCO_3$, 0.65 mol % $Li_2O$, 1.3 mol % $SiO_2$, 2.0 mol % MnO |
| A18 | $Ag_{0.7}Pd_{0.3}$ | $Li_{0.064}Na_{0.52}K_{0.42}NbO_3$ | 0.5 mol % $BaCO_3$, 0.65 mol % $Li_2O$, 1.3 mol % $SiO_2$, 2.0 mol % MnO |
| A19 | $Ag_{0.7}Pd_{0.3}$ | $Li_{0.064}Na_{0.52}K_{0.42}NbO_3$ | 0.25 mol % $SrCO_3$, 0.25 mol % $CaCO_3$, 0.65 mol % $Li_2O$, 1.3 mol % $SiO_2$, 2.0 mol % MnO |
| A20 | $Ag_{0.7}Pd_{0.3}$ | $Li_{0.064}Na_{0.52}K_{0.42}NbO_3$ | 0.25 mol % $SrCO_3$, 0.25 mol % $BaCO_3$, 0.65 mol % $Li_2O$, 1.3 mol % $SiO_2$, 2.0 mol % MnO |

As shown in Table 6, Sample A03 is different from the constitution of the aforementioned embodiment in that the additive quantity of $SrCO_3$, which is an additive containing the alkali earth metal M2, is 0.2 percent by mol or less. Samples A04 to A20 all have the constitution of the laminated piezoelectric element 100 pertaining to the aforementioned embodiment. In other words, Samples A02 and A04 to A20 are examples of the present invention, while Sample A03 is a comparative example of the present invention. Samples A03 to A20 of the laminated piezoelectric element 100 were produced in the same manner as in Example 2 above.

Samples A02 to A20 of the laminated piezoelectric element 100 were measured for the electrical resistivity ρ at 100° C., and displacement amount $d*_{33}$ at a room temperature of 25° C., using the aforementioned methods. Also, Samples A02 to A20 of the laminated piezoelectric element 100 were evaluated for the D50 (nm) and (D90–D10)/D50 in the piezoelectric ceramic layer 106 using the aforementioned photographic method. Furthermore, Samples A02 to A20 of the laminated piezoelectric element 100 were measured for EDSs using a FE-SEM to obtain Ag/Nb (%) which represents the element fraction of the Ag and Nb contained in the piezoelectric ceramic layer 106.

Additionally, the coefficient of variation CV pertaining to the piezoelectric ceramic layer 106 was also checked. For the evaluation method, measurement was performed using a method similar to the EDS measurement method described above with respect to the piezoelectric ceramic layer 106.

For each of Samples A20 to A20, the coefficient of variation CV was calculated by measuring the piezoelectric ceramic layer 106 at randomly selected 10 points or more between the internal electrodes. In addition, whether or not $Li_3NbO_4$ had deposited was examined for Samples A02 to A20 of the laminated piezoelectric element 100 (A skilled artisan will appreciate that the presence or absence of a certain deposition phases can be determined by any suitable observation and analytic method equivalent to those described in the present disclosure, and the skilled artisan can readily perform such a method in view of the present disclosure, as a matter of routine work).

Table 7 shows the performance evaluation results of Samples A02 to A20.

Table 7 follows:

TABLE 7

| Sample no. | Sintering temperature (° C.) | Electrical resistivity ρ (Ω · cm) | $d*_{33}$ (pm/V) | D50 (nm) | (D90 – D10)/D50 | Ag/Nb (%) | Coefficient of variation CV (%) | Deposition of $Li_3NbO_4$ |
|---|---|---|---|---|---|---|---|---|
| A02 | 1100 | $4.2 \times 10^{12}$ | 210 | 460 | 0.96 | 1.3 | 14.91 | No |
| A03 | 1020 | $9.0 \times 10^{9}$ | 185 | 2940 | 2.05 | 1.2 | 16.25 | No |
| A04 | 1060 | $8.7 \times 10^{9}$ | 185 | 640 | 1.98 | 1.6 | 15.32 | No |
| A05 | 1150 | $5.0 \times 10^{9}$ | 180 | 420 | 0.98 | 1.4 | 13.66 | No |
| A06 | 1200 | $2.2 \times 10^{8}$ | 140 | 750 | 1.93 | 2.5 | 14.95 | No |
| A07 | 1120 | $8.2 \times 10^{11}$ | 235 | 690 | 0.96 | 1.5 | 10.05 | No |
| A08 | 1130 | $1.2 \times 10^{12}$ | 200 | 710 | 0.86 | 1.3 | 10.22 | No |
| A09 | 1100 | $2.2 \times 10^{12}$ | 175 | 780 | 1.17 | 1.6 | 10.43 | No |
| A10 | 1120 | $1.5 \times 10^{12}$ | 210 | 650 | 1.29 | 1.3 | 12.84 | No |
| A11 | 1060 | $9.8 \times 10^{11}$ | 190 | 630 | 1.95 | 1.2 | 11.70 | No |
| A12 | 1140 | $7.5 \times 10^{11}$ | 180 | 630 | 1.92 | 1.3 | 13.38 | No |
| A13 | 1080 | $2.9 \times 10^{12}$ | 155 | 410 | 1.56 | 0.8 | 17.21 | No |
| A14 | 1100 | $6.3 \times 10^{12}$ | 165 | 410 | 0.73 | 1.1 | 17.10 | No |
| A15 | 1060 | $1.1 \times 10^{12}$ | 190 | 420 | 0.92 | 1.0 | 16.37 | Yes |
| A16 | 1040 | $5.2 \times 10^{11}$ | 180 | 400 | 0.04 | 0.9 | 15.41 | Yes |
| A17 | 1080 | $1.2 \times 10^{12}$ | 175 | 350 | 1.31 | 1.2 | 12.55 | No |
| A18 | 1100 | $8.0 \times 10^{9}$ | 160 | 640 | 1.64 | 1.8 | 17.20 | No |
| A19 | 1100 | $1.6 \times 10^{12}$ | 180 | 480 | 1.15 | 1.5 | 13.64 | No |
| A20 | 1050 | $7.5 \times 10^{9}$ | 155 | 660 | 1.33 | 1.8 | 15.02 | No |

As shown in Table 7, piezoelectric ceramic layers 106 constituted by a fine, uniform polycrystalline substance satisfying "100 nm≤D50≤800 nm" and "(D90–D10)/D50≤2.0" were obtained for Samples A02 and A04 to A20 pertaining to the examples of the present invention. It is also clear that Samples A02 and A04 to A20 all achieved sufficiently high electrical resistivities ρ and displacement amounts $d*_{33}$. Furthermore, Samples A15 and A16 where $Li_3NbO_4$ had deposited achieved higher sintering property at low temperature.

Also, as far as Sample A04 to A06 pertaining to the examples are concerned, there is a tendency that the greater the additive quantity of $SrCO_3$, which is an additive containing the alkali earth metal M2, the lower the displacement amount $d^*_{33}$ becomes. In this regard, a displacement amount $d^*_{33}$ of 140 pm/V or more was obtained even with Sample A06 to which the largest quantity, or 5.0 percent by mol, of the alkali earth metal M2 was added. However, the aforementioned tendency suggests that, with the laminated piezoelectric element 100, the displacement amount $d^*_{33}$ is expected to be less than 140 pm/V if the additive quantity of the alkali earth metal M2 exceeds 5.0 percent by mol. Also, the electrical resistivity $\rho$ of $2.2\times10^8$ $\Omega\cdot$cm is close to the lower limit of the preferred range. It is therefore clear that preferably the additive quantity of the alkali earth metal M2 is kept to 5.0 percent by mol or less.

Additionally, as far as Samples A17 to A20 pertaining to the examples are concerned, it is shown that using a metal other than Sr, such as Ca or Ba, for the alkali earth metal M2 improves the sintering property, while also achieving piezoelectric ceramic layers 106 constituted by an equally fine, uniform polycrystalline substance satisfying "100 nm≤D50≤800 nm" and "(D90−D10)/D50≤2.0," and consequently the effects of the present invention can be achieved. Furthermore, it is shown that equivalent effects are exhibited also by using two or more types of elements, such as Sr and Ca or Sr and Ba, for the alkali earth metal M2, and consequently the effects of the present invention can be achieved.

With Sample A03 pertaining to the comparative example of the present invention, the D50 considerably exceeded 800 nm and the (D90−D10)/D50 exceeded 2.0. With Sample P01, probably the grain growth suppression action due to diffusion of Ag could not be achieved sufficiently due to the small additive quantity of $SrCO_3$, which is an additive containing the alkali earth metal M2, and the crystal became coarser as a result.

Example 4

Example 4 is a variation example of Examples 1 to 3 above. Examples 1 to 3 above presented examples where the Ag contained in the internal electrodes 102 was diffused to the alkali niobate piezoelectric ceramic constituting the laminated piezoelectric element 100 shown in FIGS. 2 to 4. In Example 4, on the other hand, an example where Ag is added directly to the alkali niobate piezoelectric ceramic constituting the piezoelectric element 10 shown in FIG. 1, is presented.

The tentatively sintered powder used for the production of Samples B01 to B05 in this example had a composition of $Li_{0.064}Na_{0.52}K_{0.42}NbO_3$. Table 8 shows the types and quantities of the additives in Samples B01 to B05. In the same manner as explained above, the additive quantities of Table 8, relative to 100 percent by mol of the tentatively sintered powder of the alkali niobate piezoelectric ceramic expressed by $Li_{0.064}Na_{0.52}K_{0.42}NbO_3$, are shown in percent by mol.

Table 8 follows:

TABLE 8

| Sample no. | Composition of tentatively sintered powder | Additives (Added further to 100 percent by mol of tentatively sintered powder) |
|---|---|---|
| B01 | $Li_{0.064}Na_{0.52}K_{0.42}NbO_3$ | 0.5 mol % $SrCO_3$, 0.65 mol % $Li_2O$, 1.3 mol % $SiO_2$, 0.5 mol % MnO |
| B02 | $Li_{0.064}Na_{0.52}K_{0.42}NbO_3$ | 0.25 mol % $Ag_2O$, 0.5 mol % $SrCO_3$, 0.65 mol % $Li_2O$, 1.3 mol % $SiO_2$, 2.0 mol % MnO |

TABLE 8-continued

| Sample no. | Composition of tentatively sintered powder | Additives (Added further to 100 percent by mol of tentatively sintered powder) |
|---|---|---|
| B03 | $Li_{0.064}Na_{0.52}K_{0.42}NbO_3$ | 0.50 mol % $Ag_2O$, 0.5 mol % $SrCO_3$, 0.65 mol % $Li_2O$, 1.3 mol % $SiO_2$, 2.0 mol % MnO |
| B04 | $Li_{0.064}Na_{0.52}K_{0.42}NbO_3$ | 1.00 mol % $Ag_2O$, 0.5 mol % $SrCO_3$, 0.65 mol % $Li_2O$, 1.3 mol % $SiO_2$, 2.0 mol % MnO |
| B05 | $Li_{0.064}Na_{0.52}K_{0.42}NbO_3$ | 2.50 mol % $Ag_2O$, 0.5 mol % $SrCO_3$, 0.65 mol % $Li_2O$, 1.3 mol % $SiO_2$, 2.0 mol % MnO |

Ag is not added to Sample B01. On the other hand, $Ag_2O$ is added to Sample B02 by 0.25 percent by mol, $Ag_2O$ is added to Sample B03 by 0.50 percent by mol, $Ag_2O$ is added to Sample B04 by 1.00 percent by mol, and $Ag_2O$ is added to Sample B05 by 2.50 percent by mol. In other words, Samples B03 to B05 correspond to examples of the present invention, while Samples B01 and B02 are comparative examples of the present invention.

For each of Samples B01 to B05, a disk-shaped piezoelectric element 10 like the one shown in FIG. 1 was obtained through the production steps of the piezoelectric element 10 as explained above. Samples B01 to B05, or the obtained piezoelectric elements 10, were polarized in silicone oil by applying an electric field of 3 kV/mm for 15 minutes, and then measured for the electrical resistivity $\rho$ at 100° C., and displacement amount $d^*_{33}$ at a room temperature of 25° C., using the aforementioned methods. Also, they were evaluated for the D50 (nm) and (D90−D10)/D50 in the piezoelectric ceramic layer 106 using the aforementioned photographic method.

The sintering temperature, electrical resistivity $\rho$, displacement amount $d^*_{33}$, D50, and (D90−D10)/D50 of Samples B01 to B05 are summarized in Table 9.

Table 9 follows:

TABLE 9

| Sample no. | Sintering temperature (° C.) | Electrical resistivity $\rho$ ($\Omega\cdot$cm) | $d^*33$ (pm/V) | D50 (nm) | (D90 − D10)/ D50 | Deposition of $Li_3NbO_4$ |
|---|---|---|---|---|---|---|
| B01 | 950 | $5.5\times 10^7$ | 260 | 1300 | 4.48 | No |
| B02 | 950 | $9.8\times 10^7$ | 135 | 1130 | 2.51 | No |
| B03 | 1100 | $1.3\times 10^{12}$ | 200 | 640 | 1.10 | No |
| B04 | 1130 | $3.0\times 10^{12}$ | 185 | 600 | 0.93 | No |
| B05 | 1050 | $3.9\times 10^8$ | 145 | 400 | 1.55 | No |

With the alkali niobate piezoelectric ceramics of Samples B03 to B05 pertaining to the examples of the present invention, the crystal grain size satisfied "100 nm≤D50≤800 nm" and "(D90−D10)/D50≤2.0." This clearly shows that a fine, uniform polycrystalline substance is obtained in Samples B03 to B05.

With the alkali niobate piezoelectric ceramic of Samples B01 pertaining to a comparative example of the present invention, on the other hand, the D50 exceeded 800 nm and the (D90−D10)/D50 exceeded 2.0. With Sample B01, which does not contain Ag, probably the crystal refinement action by Ag was not achieved and a fine polycrystalline substance could not be achieved as a result.

Also, with the alkali niobate piezoelectric ceramic of Samples B02 pertaining to a comparative example of the present invention, the D50 exceeded 800 nm and the (D90−D10)/D50 exceeded 2.0. Sample B02 does contain Ag, but because the additive quantity is very small, or at 0.25 percent by mol in equivalent Ag$_2$O, probably the effects of the present invention could not be achieved sufficiently.

Furthermore, Samples B01 and B02 present a reliability problem because the absence of fine polycrystalline substance results in an electrical resistivity ρ of $1.0 \times 10^8$ Ω·cm or less.

The foregoing explained an embodiment of the present invention; however, the present invention is not limited to the aforementioned embodiment and it goes without saying that various changes can be added so long as they do not deviate from the key points of the present invention.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, "a" may refer to a species or a genus including multiple species, and "the invention" or "the present invention" may refer to at least one of the embodiments or aspects explicitly, necessarily, or inherently disclosed herein. The terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

The present application claims priority to Japanese Patent Application No. 2016-047615, filed Mar. 10, 2016, the disclosure of which is incorporated herein by reference in its entirety including any and all particular combinations of the features disclosed therein.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A piezoelectric element, which is a single-layer or laminated piezoelectric element, comprising:
a first electrode and a second electrode, each containing silver by 50 percent by weight or more; and;
a piezoelectric ceramic layer placed between the first electrode and second electrode, constituted by a polycrystalline substance of alkali niobate piezoelectric ceramic containing silver, and at least one alkali earth metal being calcium, strontium, or barium, wherein silver is diffused from the first and second electrodes to the piezoelectric ceramic layer in a manner such that a coefficient of variation of silver content in the piezoelectric ceramic layer is 20 percent or less.

2. A piezoelectric element according to claim 1, wherein a crystal grain size of the polycrystalline substance satisfies 100 nm≤D50≤800 nm, where D50 represents a grain size corresponding to 50% in cumulative percentage based on cumulative distribution of crystal grain sizes.

3. A piezoelectric element according to claim 2, characterized in that a crystal grain size of the polycrystalline substance satisfies (D90−D10)/D50≤2.0 where D90 and D10 represent grain sizes corresponding to 90% and 10%, respectively, in cumulative percentage based on cumulative distribution of crystal grain sizes.

4. A piezoelectric element according to claim 1, wherein the alkali niobate piezoelectric ceramic is expressed by Composition Formula (1) below:

$(Ag_uM2_v(K_{1-w-x}Na_wLi_x)_{1-u-v})_a(Sb_yTa_zNb_{1-y-z})O_3$    (1)

(in Composition Formula (1), M2 represents an alkali earth metal, and u, v, w, x, y, z, and a represent values satisfying inequality expressions of 0.005<u≤0.05, 0.002<v≤0.05, 0.007<u+v≤0.1, 0≤w≤1, 0.02<x≤0.1, 0.02<w+x≤1, 0≤y≤0.1, 0≤z≤0.4, and 1<a≤1.1).

5. A piezoelectric element according to claim 4, wherein the alkali niobate piezoelectric ceramic contains Li by 0.2 percent by mol or more but 3.0 percent by mol or less, and further contains Si by 0.1 percent by mol or more but 3.0 percent by mol or less, relative to 100 percent by mol of the alkali niobate piezoelectric ceramic, and that (Li content (percent by mol))/(Si content (percent by mol)) is 0.6 or more but 2.0 or less.

6. A piezoelectric element according to claim 4, wherein the alkali niobate piezoelectric ceramic contains deposits of Li$_3$NbO$_4$.

7. A piezoelectric element according to claim 5, wherein the alkali niobate piezoelectric ceramic contains deposits of at least one of alkali silicate compound and alkali silicate-niobate compound.

8. A piezoelectric element according to claim 1, wherein the coefficient of variation, CV, of silver content in the piezoelectric ceramic layer is defined by Mathematical Formula (A) using arithmetic mean α and standard deviation σ of silver contents:

$$CV = \frac{\sqrt{\sigma^2}}{\alpha}. \tag{A}$$

9. A piezoelectric element according to claim 1, wherein the piezoelectric element is constituted as a laminated type and further comprises a protection part that contains silver and covers the piezoelectric ceramic layer as well as at least one of the first electrode and second electrode.

10. A piezoelectric element according to claim 9, wherein a coefficient of variation of a silver content in the protection part is 20 percent or less.

11. A piezoelectric element according to claim 9, wherein the piezoelectric element further comprises a first external electrode and a second external electrode, and that the first electrodes and second electrodes are placed alternately with the piezoelectric ceramic layers in between, with the first electrodes connected to the first external electrode, and the second electrodes connected to the second external electrode.

* * * * *

UNITED STATES PATENT AND TRADEMARK OFFICE
CERTIFICATE OF CORRECTION

PATENT NO. : 10,446,737 B2
APPLICATION NO. : 15/455034
DATED : October 15, 2019
INVENTOR(S) : Keiichi Hatano et al.

It is certified that error appears in the above-identified patent and that said Letters Patent is hereby corrected as shown below:

On the Title Page

Under Abstract "11 Claims, 6 Drawing Sheets" should read --13 Claims, 6 Drawing Sheets--.

In the Claims

At Column 32, after Line 59, please insert Claims 12 and 13:
--12. A method of manufacturing a piezoelectric element of a laminated type, comprising:
preparing unsintered sheets for forming piezoelectric ceramic layers, constituted by a polycrystalline substance of alkali niobate piezoelectric ceramic that contains, at site A, at least one alkali earth metal, being calcium, strontium, or barium, by more than 0.2 percent by mol but no more than 5 percent by mol;
placing, on the unsintered sheets, unsintered electrodes for forming internal electrodes, containing silver by 50 percent by weight or more;
obtaining a laminate by stacking together the unsintered sheets on which the unsintered electrodes have been placed; and
sintering the laminate to form the internal electrodes and piezoelectric ceramic layers, while causing the silver to diffuse from the internal electrodes to the piezoelectric ceramic layers, thereby obtaining a piezoelectric element, wherein during the sintering, silver is diffused from the first and second electrodes to the piezoelectric ceramic layer in a manner such that a coefficient of variation of a silver content in the piezoelectric ceramic layers is adjusted to 20 percent or less.

13. A method of manufacturing a piezoelectric element according to claim 12, wherein the unsintered sheets do not contain silver.--

Signed and Sealed this
Tenth Day of December, 2019

Andrei Iancu
*Director of the United States Patent and Trademark Office*